United States Patent
Poelzl et al.

(10) Patent No.: US 9,660,055 B2
(45) Date of Patent: May 23, 2017

(54) METHOD OF MANUFACTURING A SEMICONDUCTOR DEVICE WITH LATERAL FET CELLS AND FIELD PLATES

(71) Applicant: Infineon Technologies Austria AG, Villach (AT)

(72) Inventors: Martin Poelzl, Ossiach (AT); Till Schloesser, Munich (DE); Andreas Meiser, Sauerlach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/057,800

(22) Filed: Mar. 1, 2016

(65) Prior Publication Data

US 2016/0181402 A1    Jun. 23, 2016

Related U.S. Application Data

(62) Division of application No. 14/044,001, filed on Oct. 2, 2013, now Pat. No. 9,287,404.

(51) Int. Cl.

| | |
|---|---|
| H01L 21/76 | (2006.01) |
| H01L 29/66 | (2006.01) |
| H01L 29/78 | (2006.01) |
| H01L 29/40 | (2006.01) |
| H01L 21/225 | (2006.01) |
| H01L 21/283 | (2006.01) |
| H01L 21/306 | (2006.01) |
| H01L 21/308 | (2006.01) |

(52) U.S. Cl.
CPC .... *H01L 29/66704* (2013.01); *H01L 21/2253* (2013.01); *H01L 21/283* (2013.01); *H01L 21/3085* (2013.01); *H01L 21/30604* (2013.01); *H01L 29/404* (2013.01); *H01L 29/407* (2013.01); *H01L 29/66795* (2013.01); *H01L 29/7851* (2013.01); *H01L 29/7856* (2013.01)

(58) Field of Classification Search
USPC .......................................................... 438/287
See application file for complete search history.

(56) References Cited

U.S. PATENT DOCUMENTS

| | | | |
|---|---|---|---|
| 6,353,252 B1 | 3/2002 | Yasuhara et al. | |
| 6,452,231 B1 | 9/2002 | Nakagawa et al. | |
| 6,525,375 B1 | 2/2003 | Yamaguchi et al. | |

(Continued)

FOREIGN PATENT DOCUMENTS

| | | |
|---|---|---|
| CN | 101185169 A | 5/2008 |
| CN | 101419981 A | 4/2009 |

(Continued)

*Primary Examiner* — Timor Karimy
(74) *Attorney, Agent, or Firm* — Murphy, Bilak & Homiller, PLLC

(57) ABSTRACT

A method of manufacturing a semiconductor device includes providing dielectric stripe structures extending from a first surface into a semiconductor substrate between semiconductor fins. A first mask is provided that covers a first area including first stripe sections of the dielectric stripe structures and first fin sections of the semiconductor fins. The first mask exposes a second area including second stripe and second fin sections. A channel/body zone is formed in the second fin sections by introducing impurities, wherein the first mask is used as an implant mask. Using an etch mask that is based on the first mask, recess grooves are formed at least in the second stripe sections.

14 Claims, 33 Drawing Sheets

(56) References Cited

U.S. PATENT DOCUMENTS

| | | |
|---|---|---|
| 6,589,845 B1 | 7/2003 | Nair et al. |
| 6,670,673 B2 | 12/2003 | Sakakibara |
| 6,696,323 B2 | 2/2004 | Yamaguchi et al. |
| 7,126,166 B2 | 10/2006 | Nair et al. |
| 7,132,333 B2 | 11/2006 | Schloesser et al. |
| 7,368,777 B2 | 5/2008 | Kocon |
| 7,423,325 B2 | 9/2008 | Tihanyi |
| 7,622,354 B2 | 11/2009 | Dreeskornfeld et al. |
| 7,635,893 B2 | 12/2009 | Weis et al. |
| 7,642,597 B2 | 1/2010 | Saito |
| 7,714,384 B2 | 5/2010 | Seliskar |
| 7,820,517 B2 | 10/2010 | Gammel et al. |
| 7,964,913 B2 | 6/2011 | Darwish |
| 8,115,253 B2 | 2/2012 | Tang et al. |
| 8,415,711 B2 | 4/2013 | Kitagawa et al. |
| 8,847,311 B2 | 9/2014 | Meiser et al. |
| 9,006,811 B2 | 4/2015 | Meiser et al. |
| 2001/0045599 A1 | 11/2001 | Hueting et al. |
| 2002/0155685 A1 | 10/2002 | Sakakibara |
| 2003/0132463 A1 | 7/2003 | Miyoshi |
| 2005/0156234 A1 | 7/2005 | Gammel et al. |
| 2006/0145230 A1 | 7/2006 | Omura et al. |
| 2006/0202272 A1 | 9/2006 | Wu et al. |
| 2006/0237781 A1 | 10/2006 | Marchant et al. |
| 2007/0221992 A1 | 9/2007 | Seliskar |
| 2008/0003703 A1 | 1/2008 | Gammel et al. |
| 2009/0020852 A1 | 1/2009 | Harada |
| 2009/0108343 A1 | 4/2009 | Nemtsev et al. |
| 2009/0114968 A1 | 5/2009 | Wang et al. |
| 2009/0256212 A1 | 10/2009 | Denison et al. |
| 2009/0267116 A1 | 10/2009 | Wu et al. |
| 2009/0283825 A1 | 11/2009 | Wang et al. |
| 2010/0176421 A1 | 7/2010 | Van Hove et al. |
| 2010/0201439 A1 | 8/2010 | Wu et al. |
| 2010/0327349 A1 | 12/2010 | Arie et al. |
| 2011/0018058 A1 | 1/2011 | Disney et al. |
| 2011/0169075 A1 | 7/2011 | Hsieh |
| 2012/0043638 A1 | 2/2012 | Kitagawa |
| 2012/0061753 A1 | 3/2012 | Nishiwaki |
| 2012/0074460 A1 | 3/2012 | Kitagawa et al. |
| 2012/0199878 A1 | 8/2012 | Shrivastava et al. |
| 2012/0211834 A1 | 8/2012 | Yang et al. |
| 2013/0037853 A1 | 2/2013 | Onozawa |
| 2014/0084362 A1 | 3/2014 | Schloesser et al. |
| 2014/0151798 A1 | 6/2014 | Meiser et al. |
| 2015/0091088 A1 | 4/2015 | Vielemeyer et al. |

FOREIGN PATENT DOCUMENTS

| | | |
|---|---|---|
| CN | 102007584 A | 4/2011 |
| CN | 102157493 A | 8/2011 |
| DE | 19818300 C1 | 7/1999 |
| DE | 102004056772 B4 | 1/2007 |
| DE | 102007040066 A1 | 3/2008 |
| JP | 2001274398 A | 10/2001 |
| JP | 2012089826 A | 5/2012 |

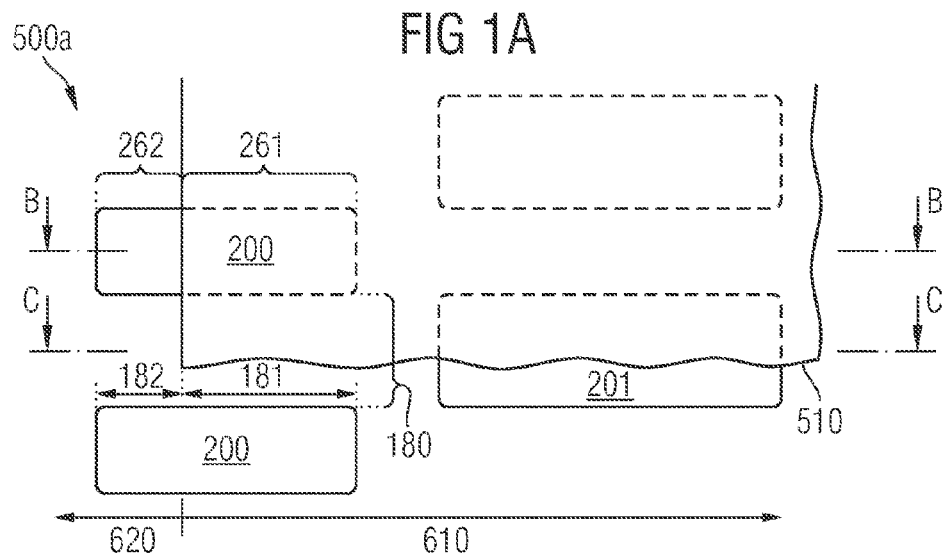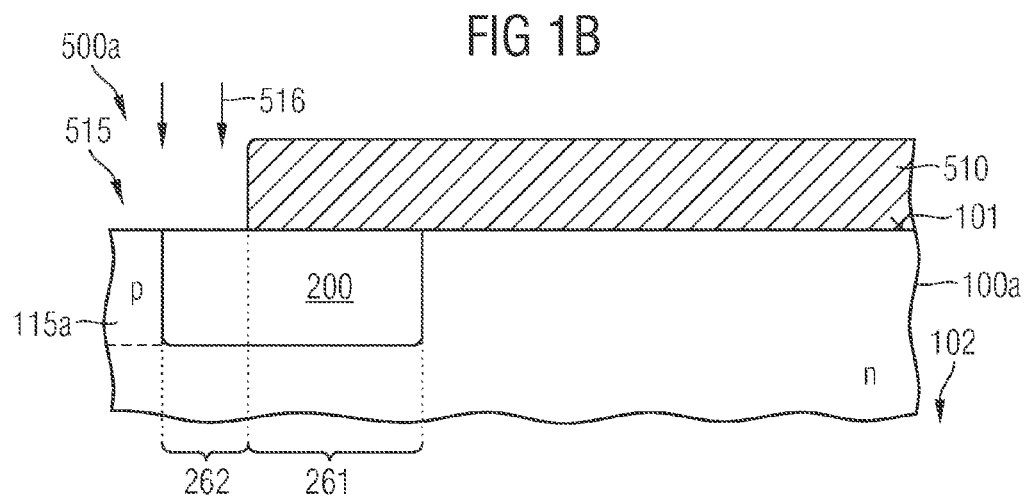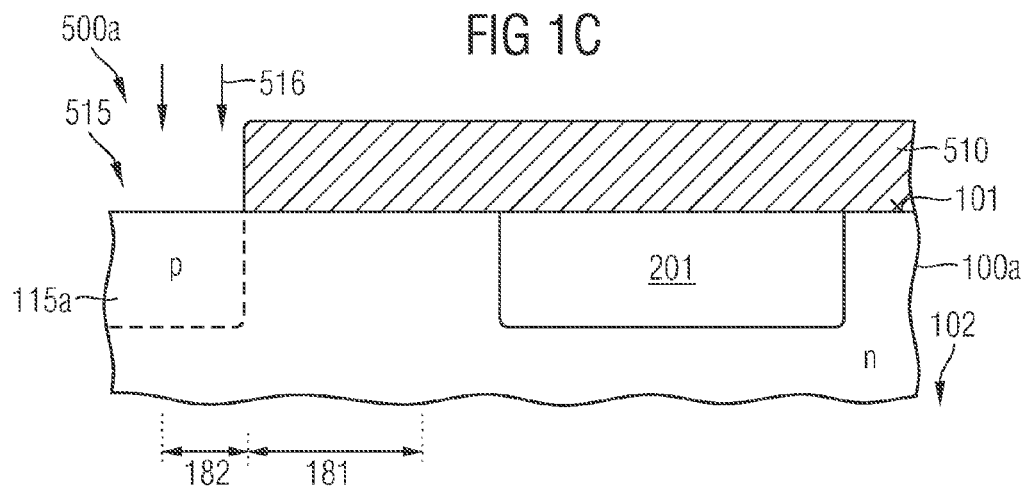

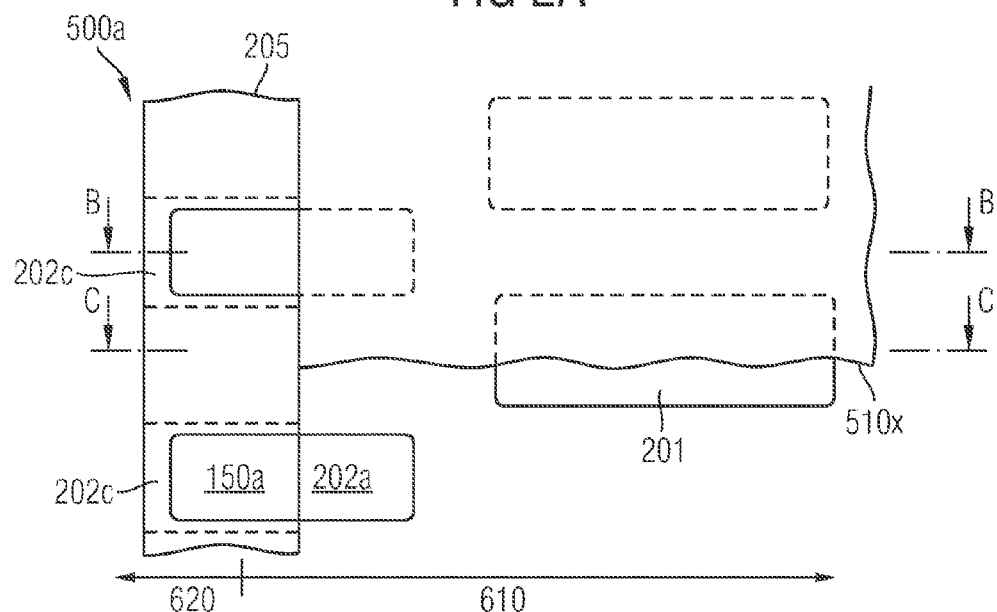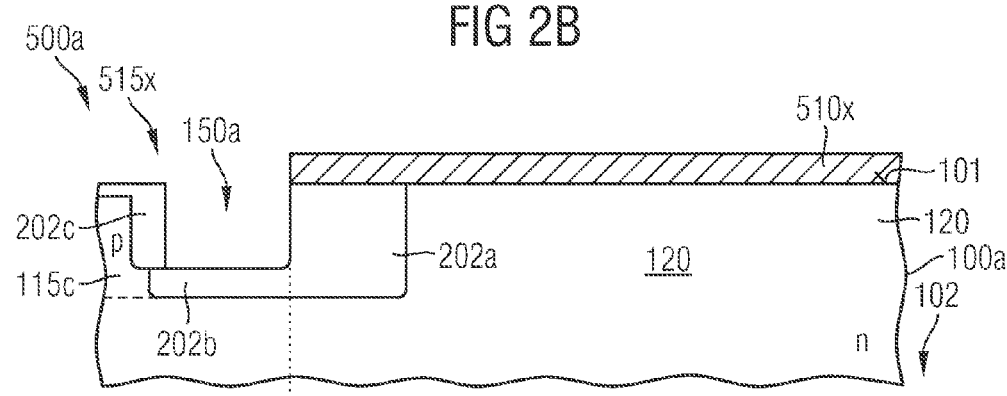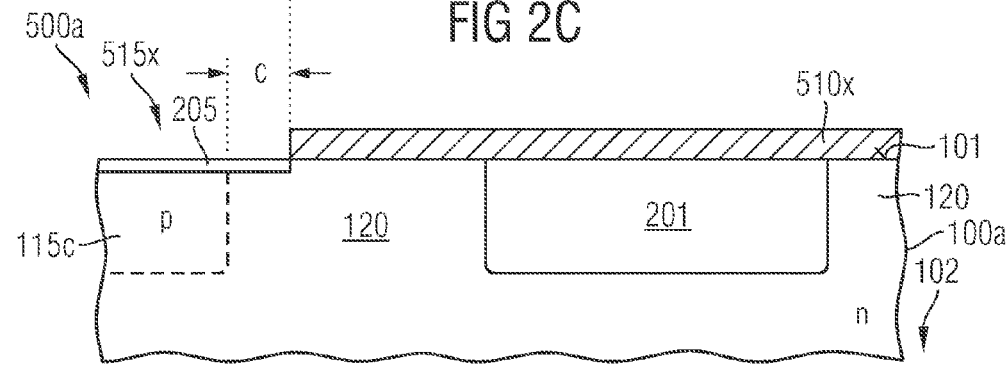

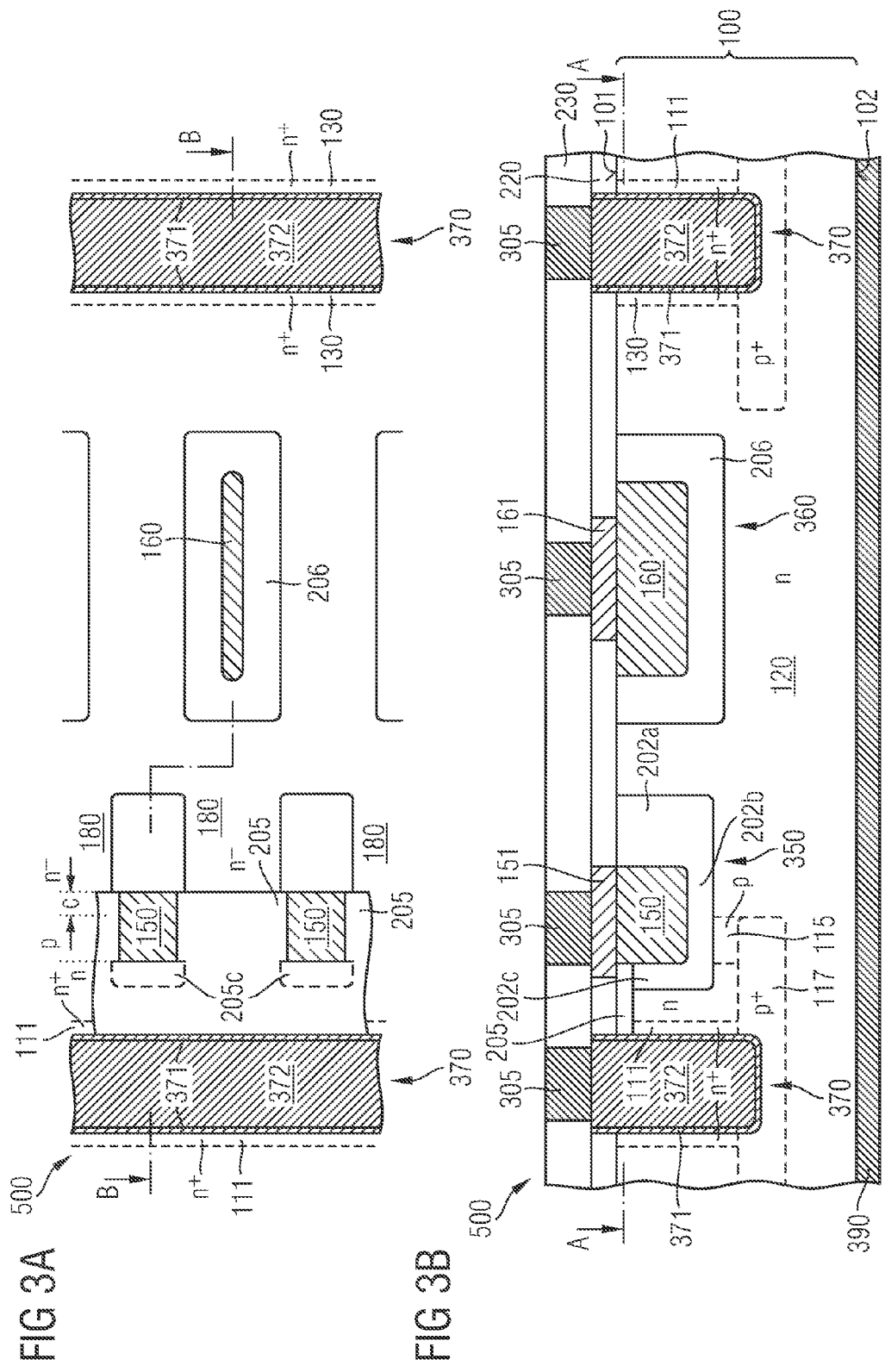

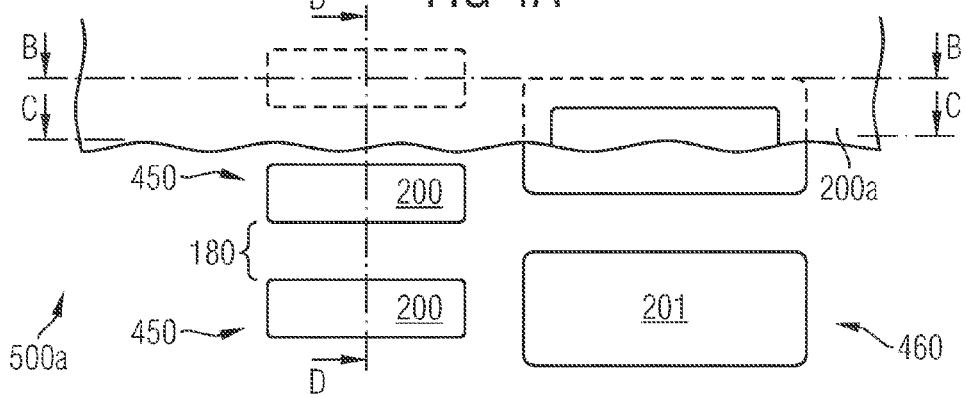
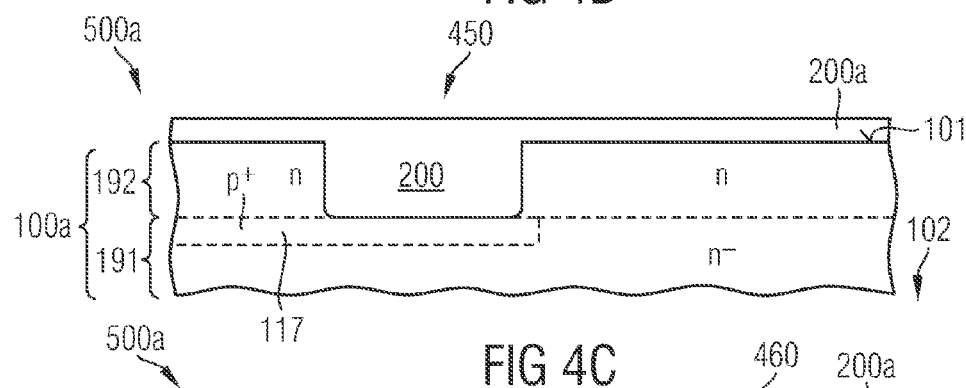
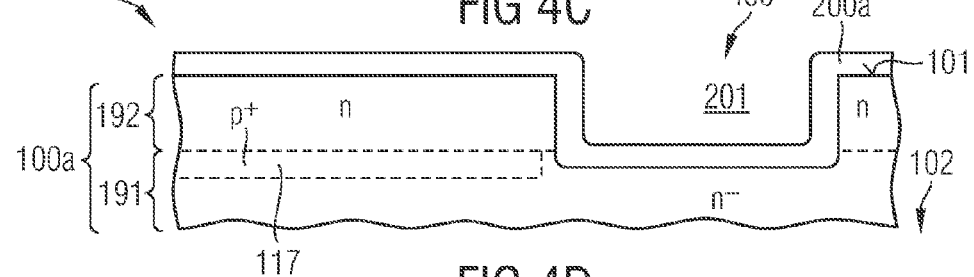
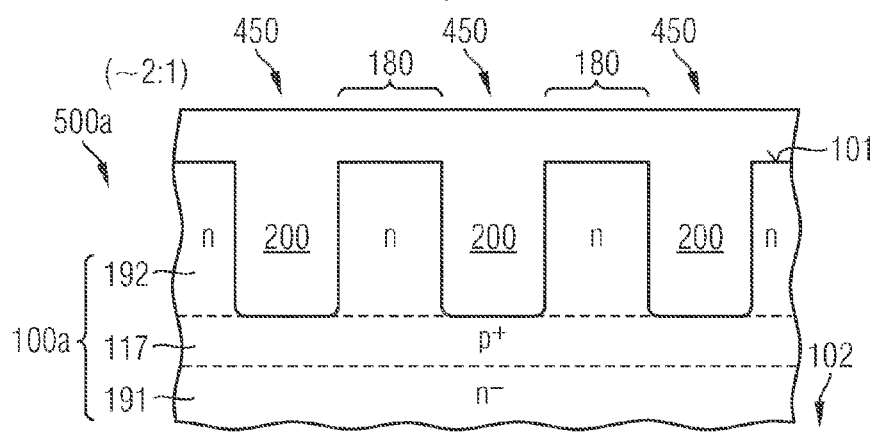

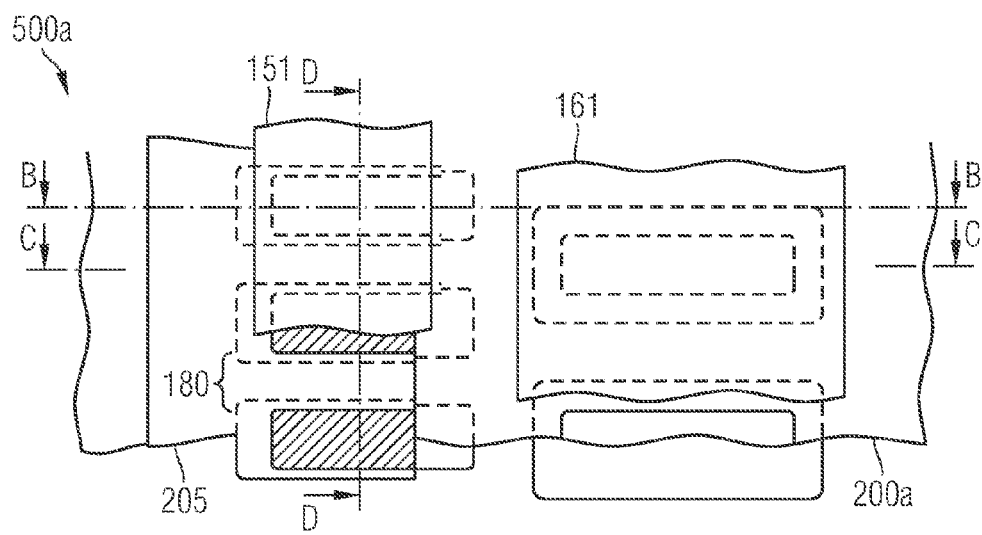
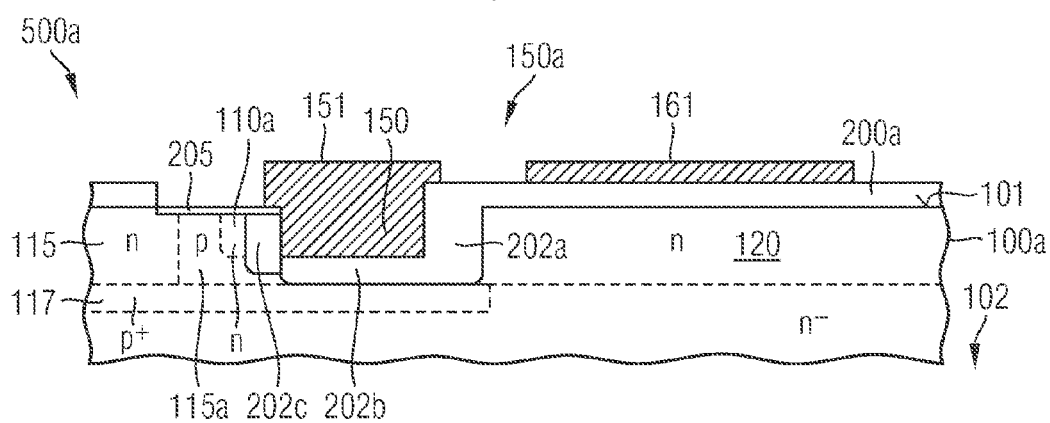

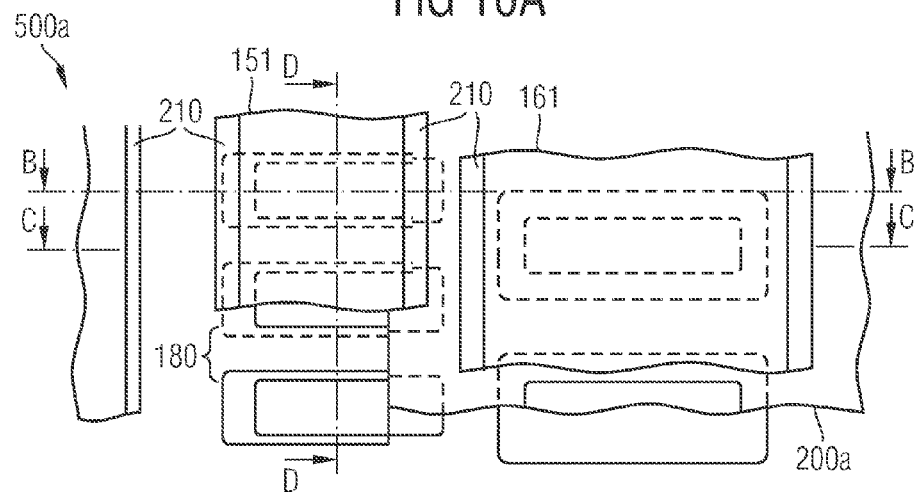
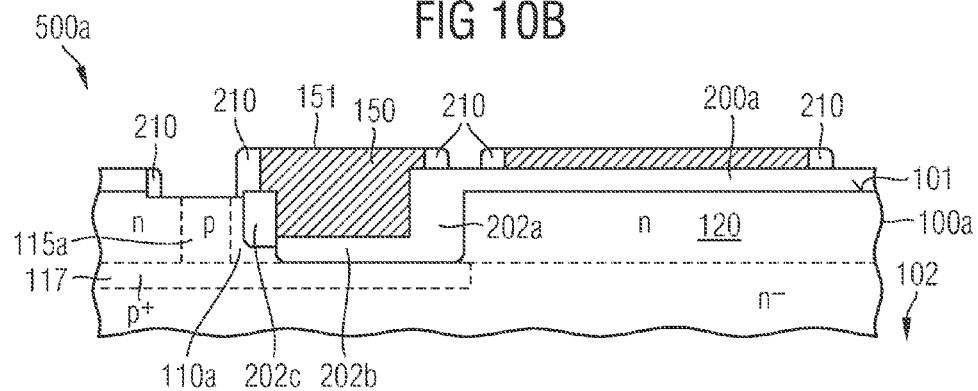
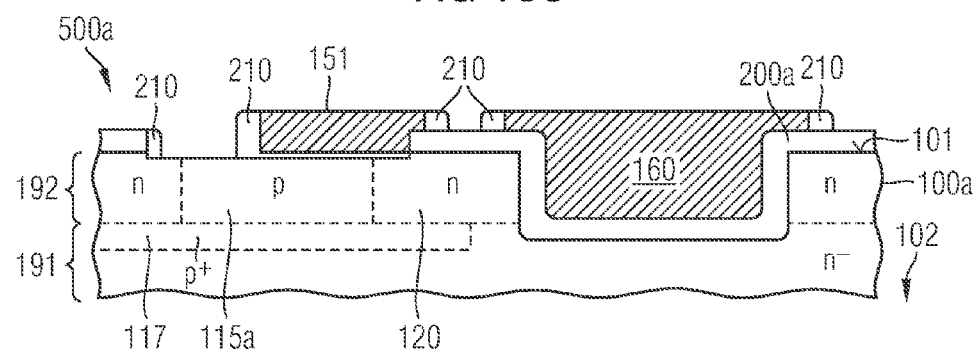

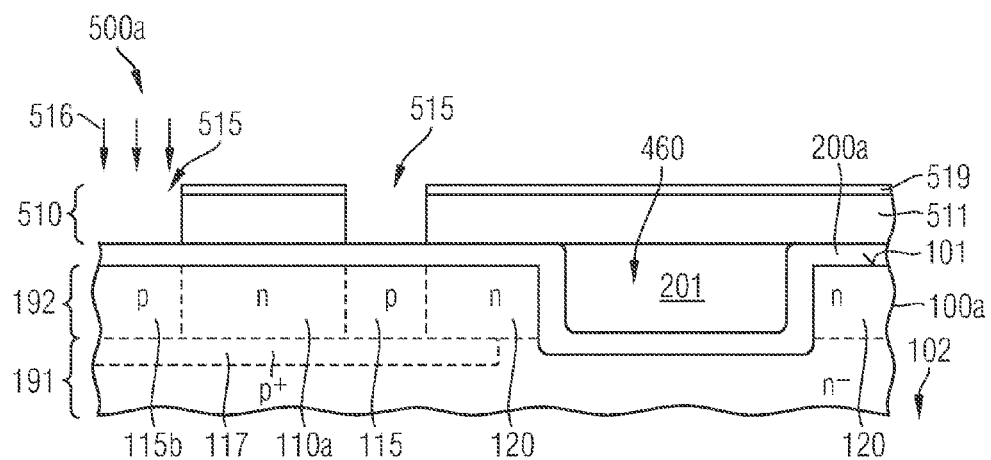
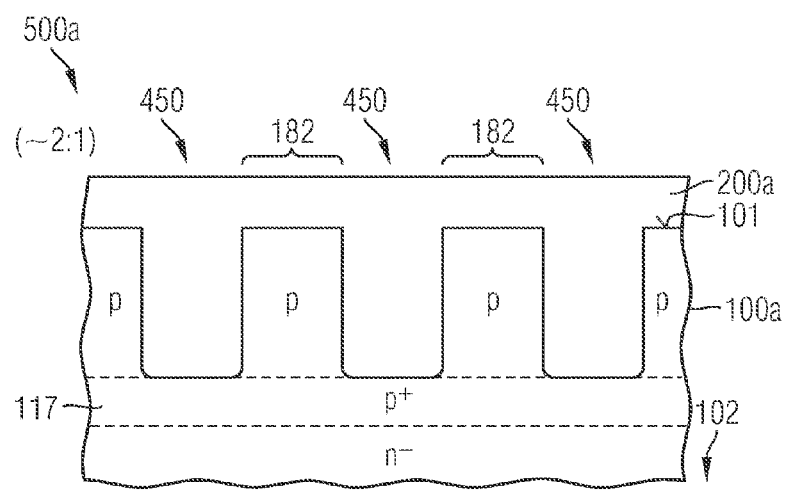

FIG 16A
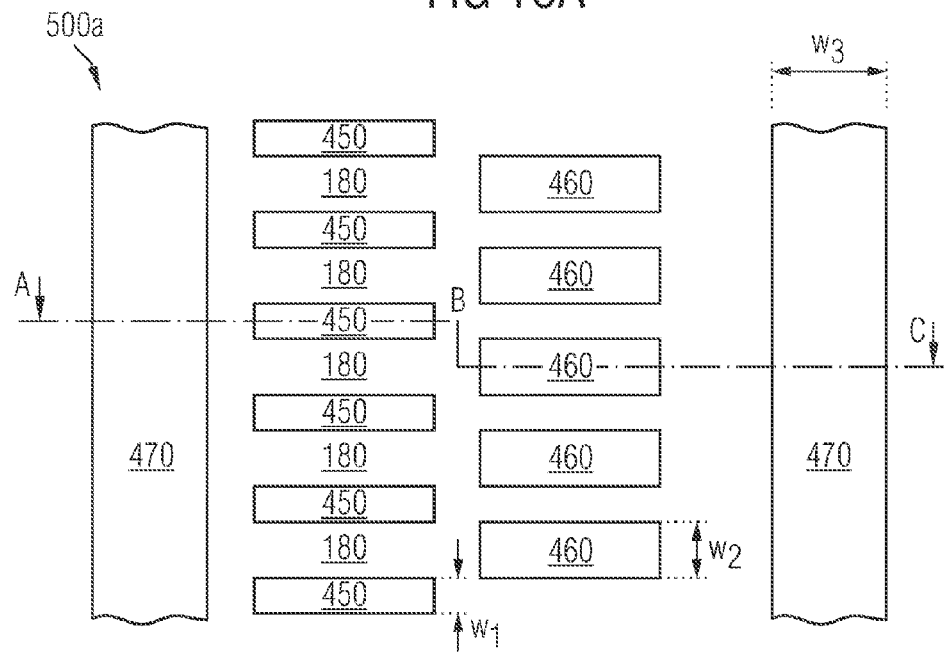
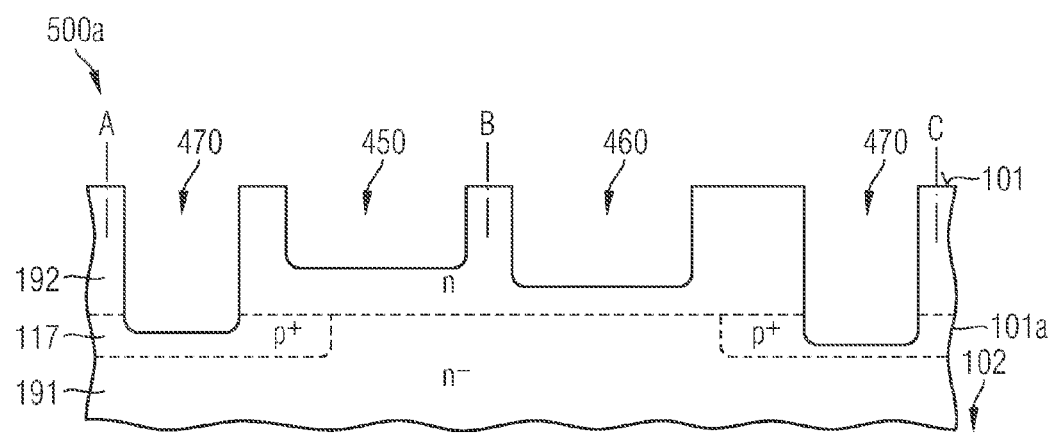

FIG 16B
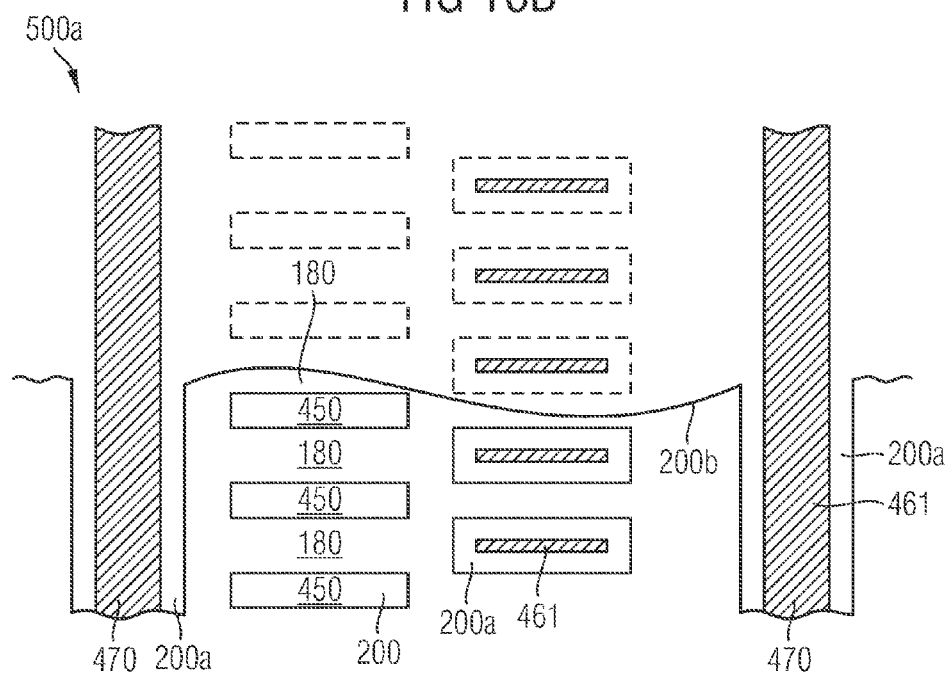
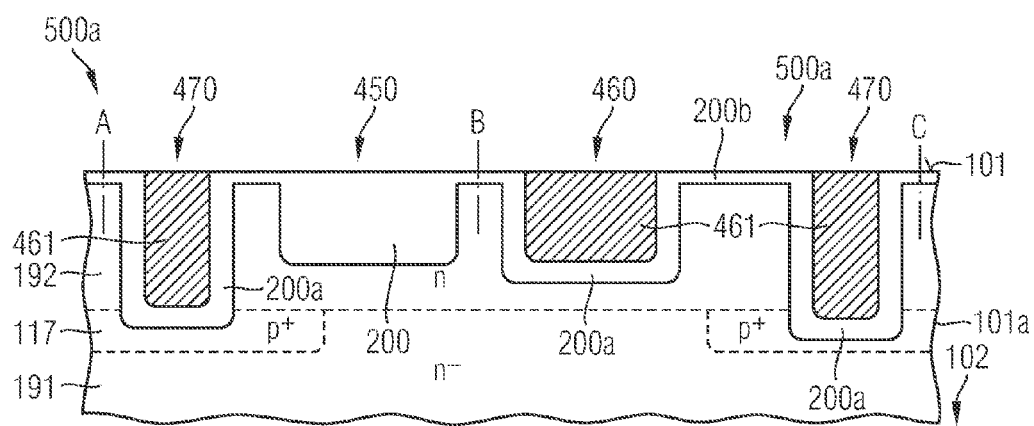

FIG 16D
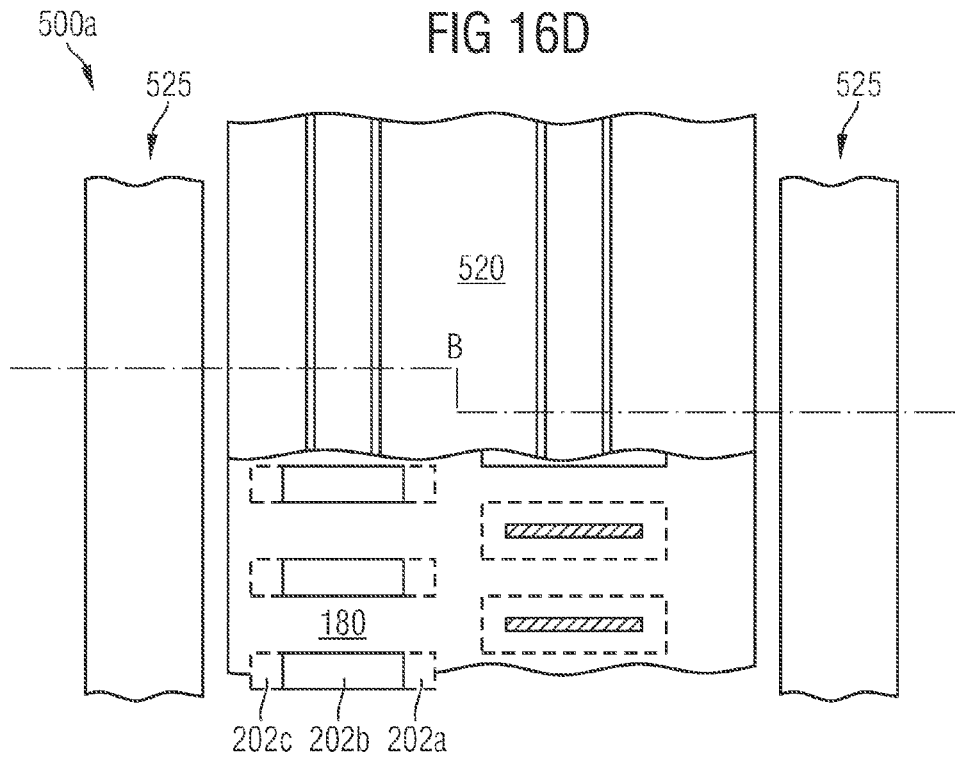
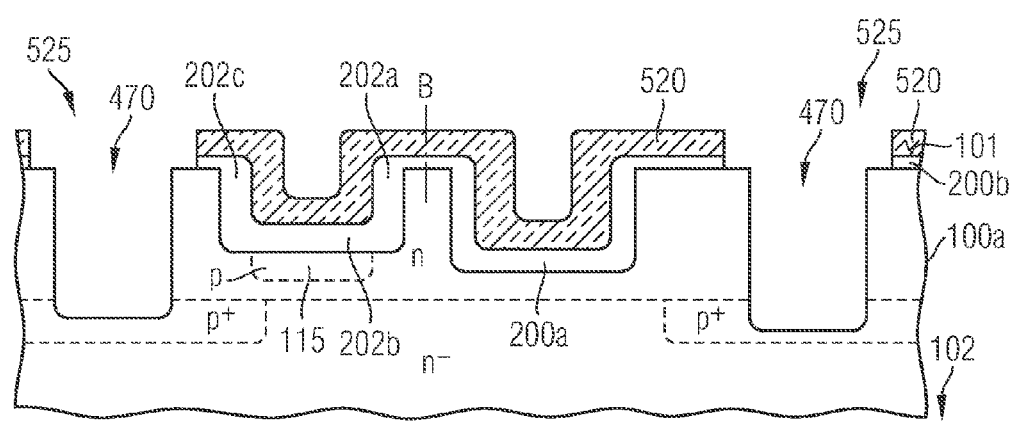
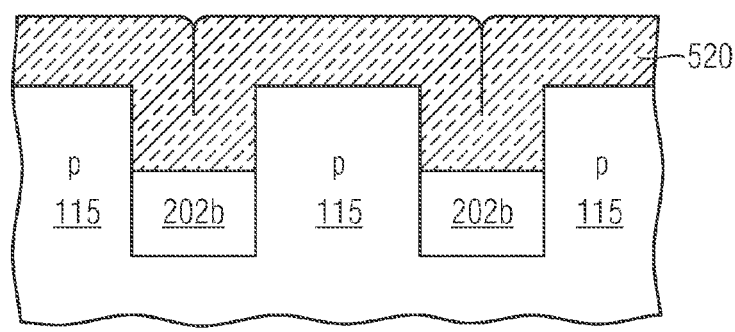

FIG 16E
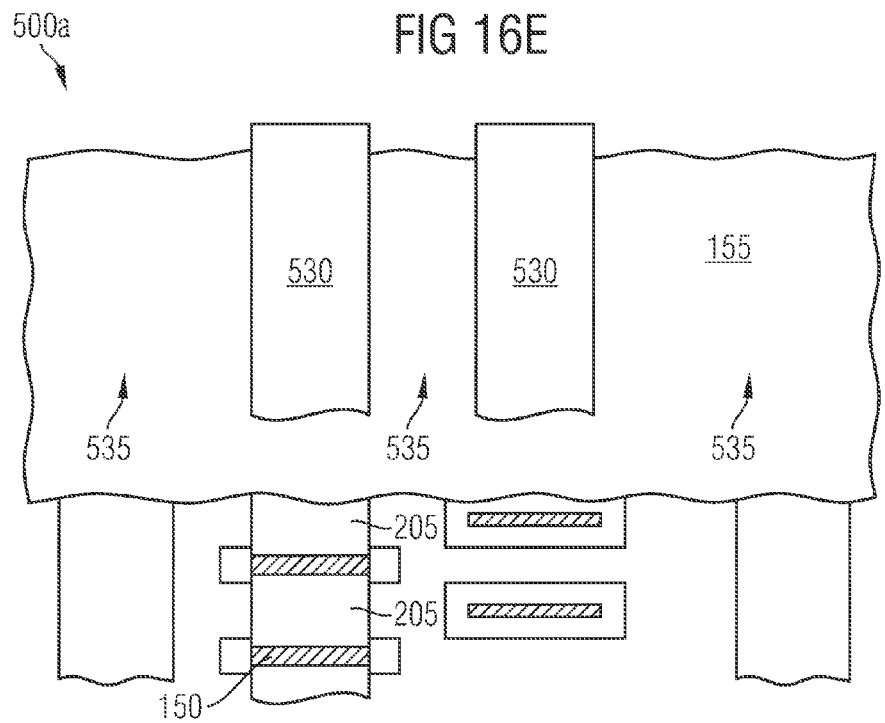
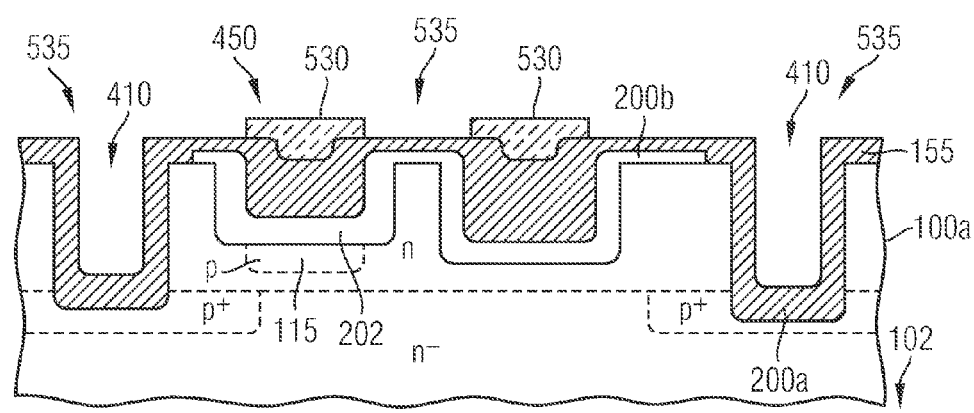
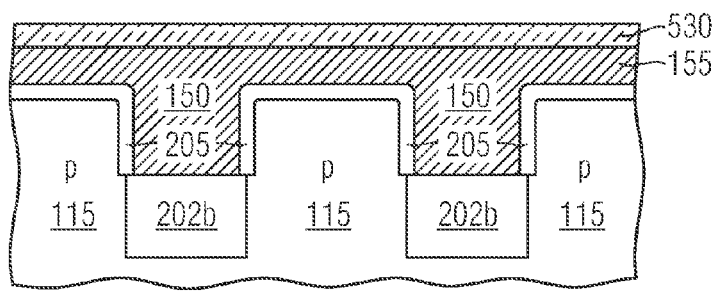

FIG 16F
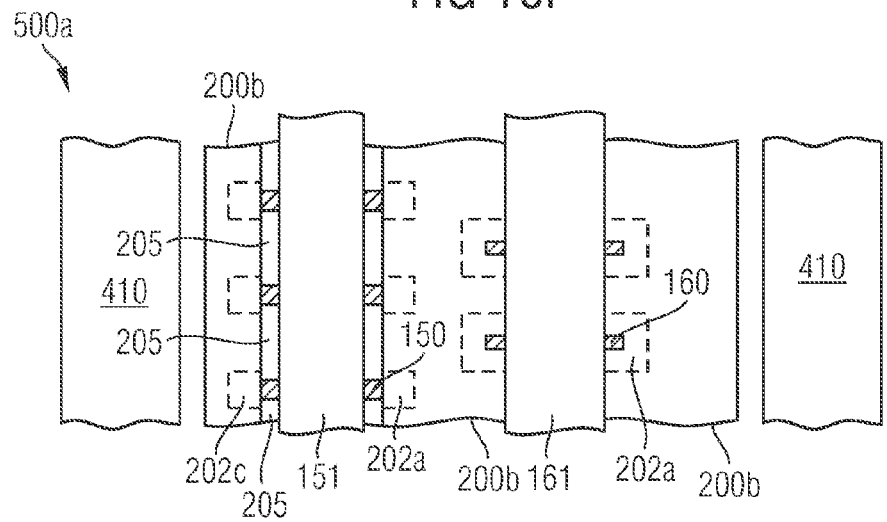
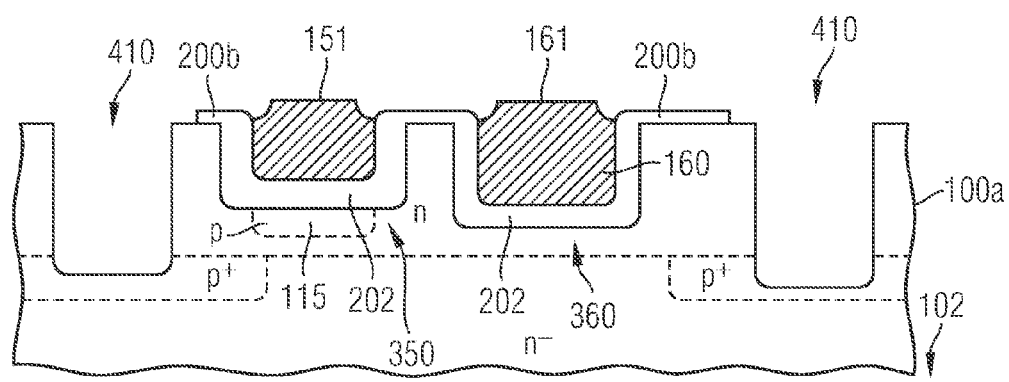
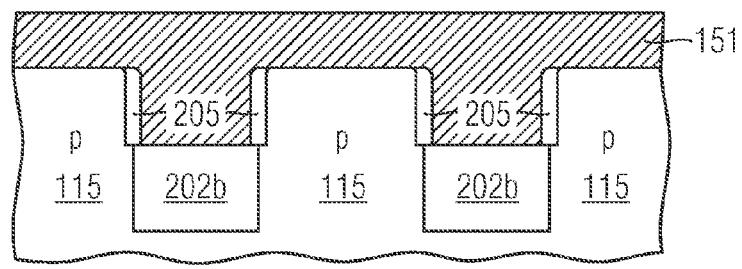

FIG 16G
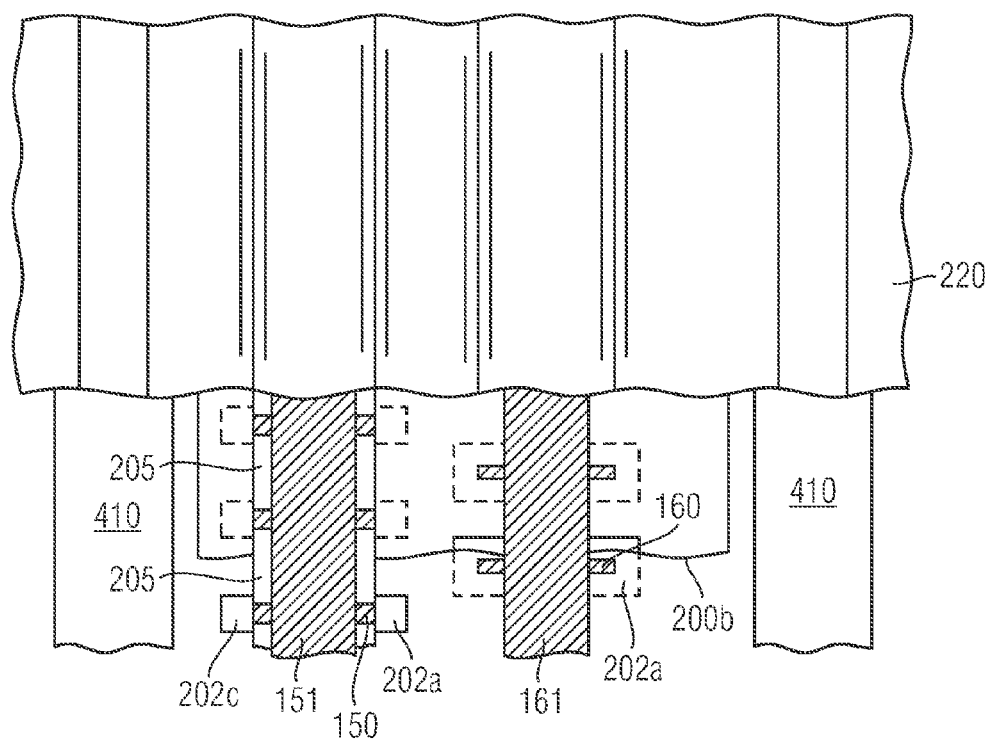
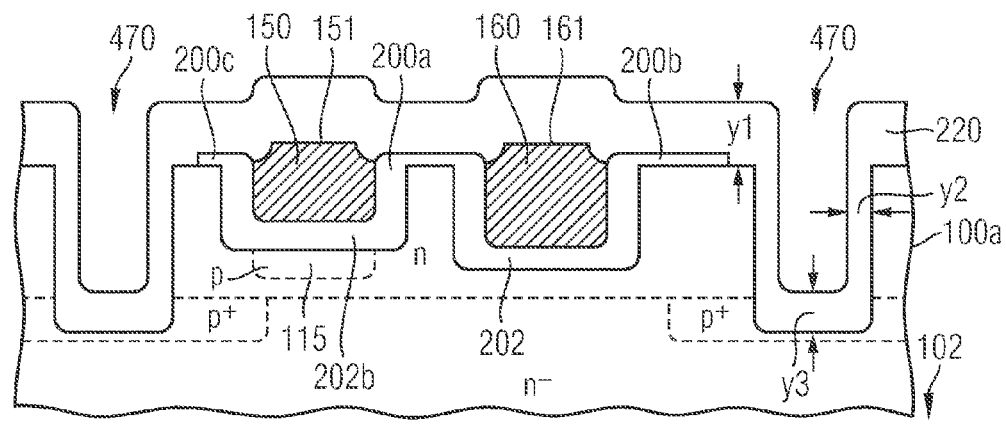

FIG 16K
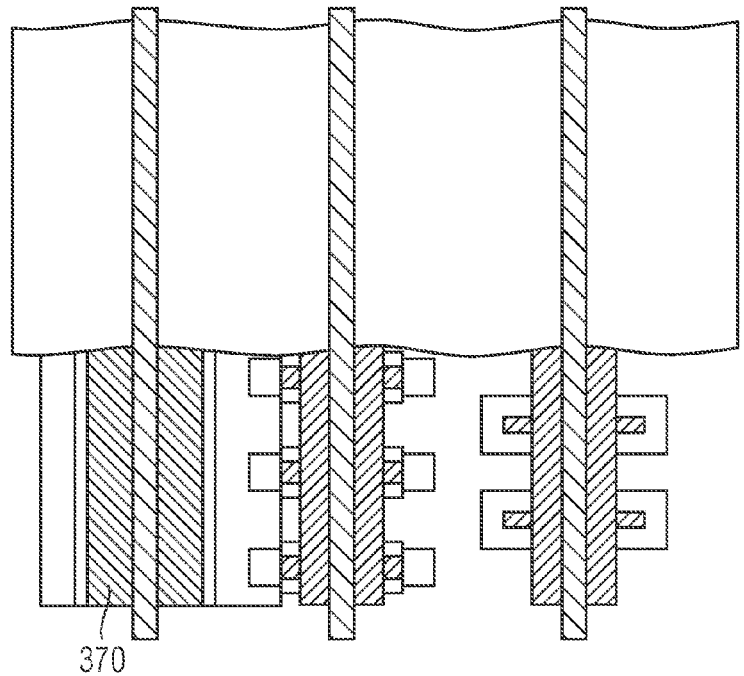
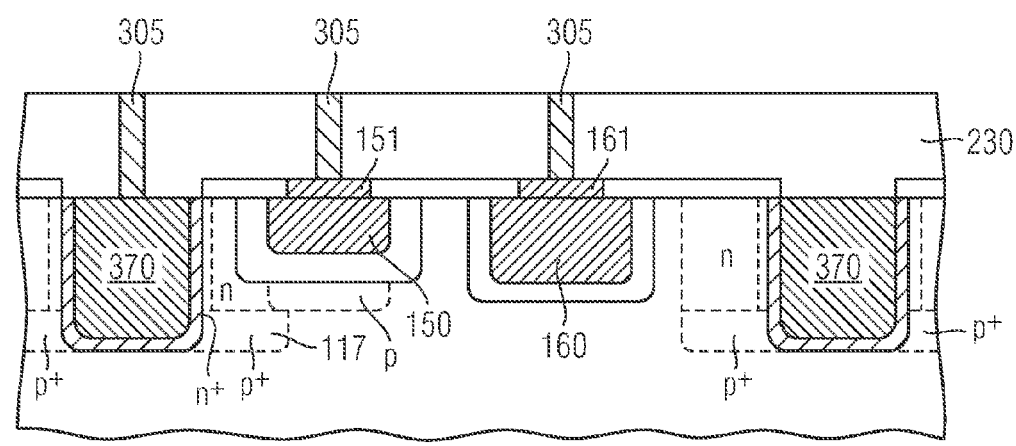

FIG 17
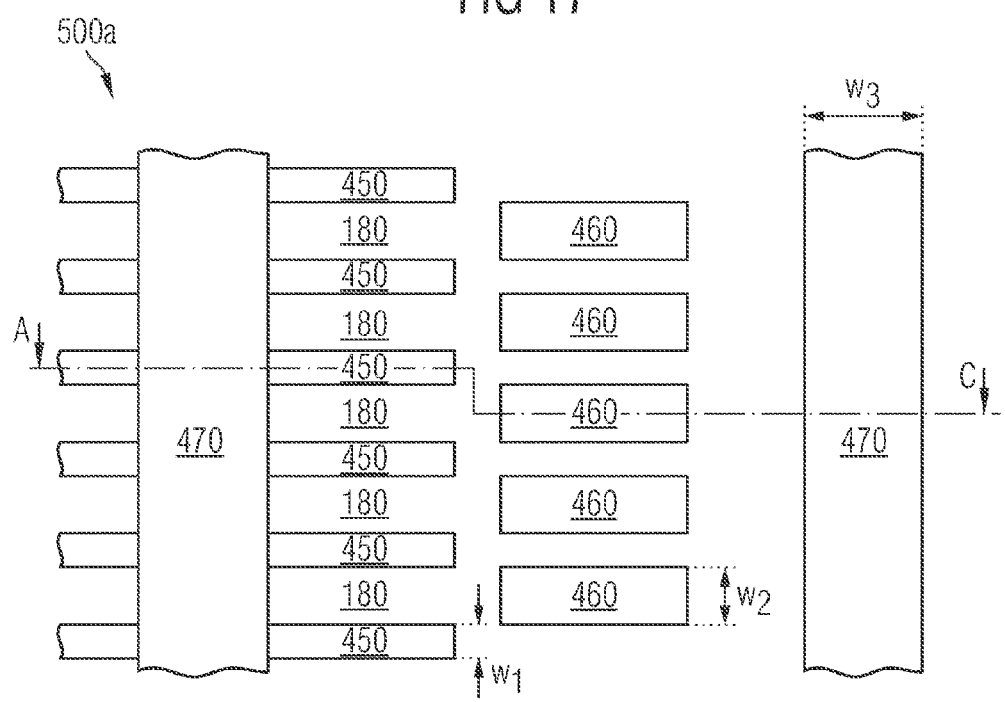
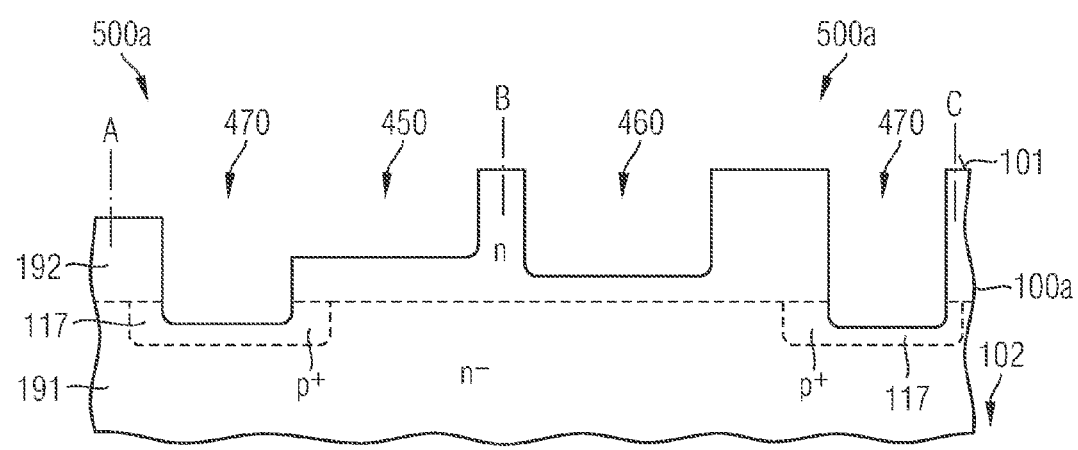

METHOD OF MANUFACTURING A SEMICONDUCTOR DEVICE WITH LATERAL FET CELLS AND FIELD PLATES

BACKGROUND

Power semiconductor devices like Power MOSFETs (metal oxide semiconductor field effect transistors) sustain a high breakdown voltage in a blocking mode and have a low on-state resistance in a conductive mode. In lateral Power MOSFETs a load current flows in a lateral direction parallel to a main surface of a semiconductor die. The lateral approach imposes area restrictions for channel width, gate electrode, drift zone and contacts resulting in a comparatively high on-state resistance $R_{DSon}$. Lateral power FinFETs (Fin field effect transistors) aim at decreasing the on-state resistance by expanding the channel width in the vertical direction. It is desirable to provide lateral power semiconductor devices with improved electric characteristics.

SUMMARY

According to an embodiment a method of manufacturing a semiconductor device includes providing dielectric stripe structures extending from a first surface into a semiconductor substrate between semiconductor fins. A first mask is provided that covers a first area including first stripe sections of the dielectric stripe structures and first fin sections of the semiconductor fins. The first mask exposes a second area including second stripe and second fin sections. A channel/body zone is formed in the second fin sections by introducing impurities, wherein the first mask is used as an implant mask. Using an etch mask that is based on the first mask, recess grooves are formed at least in the second stripe sections.

In accordance with a further embodiment a semiconductor device includes buried field plate stripes in a first area of a semiconductor portion, wherein longitudinal axes of the field plate stripes run parallel to a first lateral direction parallel to a first surface of the semiconductor portion. Buried cell stripes include first cell insulators in the first area and buried gate electrodes in a second area adjoining the first area in the first lateral direction. Gate dielectrics dielectrically insulate the buried gate electrodes from semiconductor fins formed between neighboring cell stripes. The gate dielectrics are thinner than the first cell insulators.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a schematic plan view of a portion of a semiconductor substrate for illustrating a method of manufacturing a semiconductor device after forming channel/body zones using a first mask.

FIG. 1B is a schematic cross-sectional view of the semiconductor substrate portion of FIG. 1A along line B-B.

FIG. 1C is a schematic cross-sectional view of the semiconductor substrate portion of FIG. 1A along line C-C.

FIG. 2A is a schematic plan view of the semiconductor substrate portion of FIG. 1A for illustrating a method of manufacturing a semiconductor device in accordance with an embodiment providing a trimming of the first mask.

FIG. 2B is a schematic cross-sectional view of the semiconductor substrate portion of FIG. 2A along line B-B.

FIG. 2C is a schematic cross-sectional view of the semiconductor substrate portion of FIG. 2A along line C-C.

FIG. 3A is a schematic lateral cross-sectional view of a portion of a semiconductor device in accordance with an embodiment providing a lateral FinFET with a field plate and a self-aligned drain extension.

FIG. 3B is a schematic combined cross-sectional view of the semiconductor device portion of FIG. 3A along lines A-B and B-C projected in the same plane.

FIG. 4A is a schematic plan view of a portion of a semiconductor substrate for illustrating a method of manufacturing a semiconductor device in accordance with an embodiment providing cell insulators by thermal oxide growth, after providing a conformal dielectric layer.

FIG. 4B is a schematic cross-sectional view of the semiconductor substrate portion of FIG. 4A along line B-B.

FIG. 4C is a schematic cross-sectional view of the semiconductor substrate portion of FIG. 4A along line C-C.

FIG. 4D is a schematic cross-sectional view of the semiconductor substrate portion of FIG. 4A along line D-D.

FIG. 9A is a schematic plan view of the semiconductor substrate portion of FIG. 8A after forming gate and field plate connection stripes.

FIG. 9B is a schematic cross-sectional view of the semiconductor substrate portion of FIG. 9A along line B-B.

FIG. 10A is a schematic plan view of the semiconductor substrate portion of FIG. 9A after forming dielectric spacers along the gate and field plate connection stripes.

FIG. 10B is a schematic cross-sectional view of the semiconductor substrate portion of FIG. 10A along line B-B.

FIG. 10C is a schematic cross-sectional view of the semiconductor substrate portion of FIG. 10A along line C-C.

FIG. 12C is a schematic cross-sectional view of the semiconductor substrate portion of FIG. 12A along line C-C.

FIG. 12D is a schematic cross-sectional view of the semiconductor substrate portion of FIG. 12A along line D-D.

FIG. 16A illustrates a schematic plan view and a combined cross-sectional view along lines A-B and B-C of a semiconductor substrate portion for illustrating a method of manufacturing a semiconductor device with source and drain zones self-aligned to body/channel zones using a combined mask for cell, field and contact trenches, after forming the cell, field and contact trenches.

FIG. 16B shows a schematic plan view and a combined cross-sectional view along lines A-B and B-C of the semiconductor substrate portion of FIG. 16A after filling the cell, field and contact trenches with a sacrificial material.

FIG. 16D shows a schematic plan view, a combined cross-sectional view along lines A-B and B-C as well as a cross-sectional view along line X-X of the semiconductor substrate portion of FIG. 16C after providing a second mask covering the active area.

FIG. 16E shows a schematic plan view, a combined cross-sectional view along lines A-B and B-C as well as a cross-sectional view along line X-X of the semiconductor substrate portion of FIG. 16D after providing a third mask defining gate and field plate connection stripes.

FIG. 16F shows a schematic plan view, a combined cross-sectional view along lines A-B and B-C as well as a cross-sectional view along line X-X of the semiconductor substrate portion of FIG. 16E after providing gate and field plate connection stripes.

FIG. 16G shows a schematic plan view and a combined cross-sectional view along lines A-B and B-C of the semiconductor substrate portion of FIG. 16F after depositing a non-conformal layer.

FIG. 16K shows a schematic plan view and a combined cross-sectional view of the semiconductor substrate portion of FIG. 16J after providing metal interlayer connections.

FIG. 17 shows a schematic plan view and a combined cross-sectional view along lines A-B and B-C of a portion of a semiconductor substrate for illustrating an alternative layout of the cell, field and contact trenches for the method as illustrated in FIGS. 16A to 16K according to a further embodiment.

DETAILED DESCRIPTION

Figure 5A:
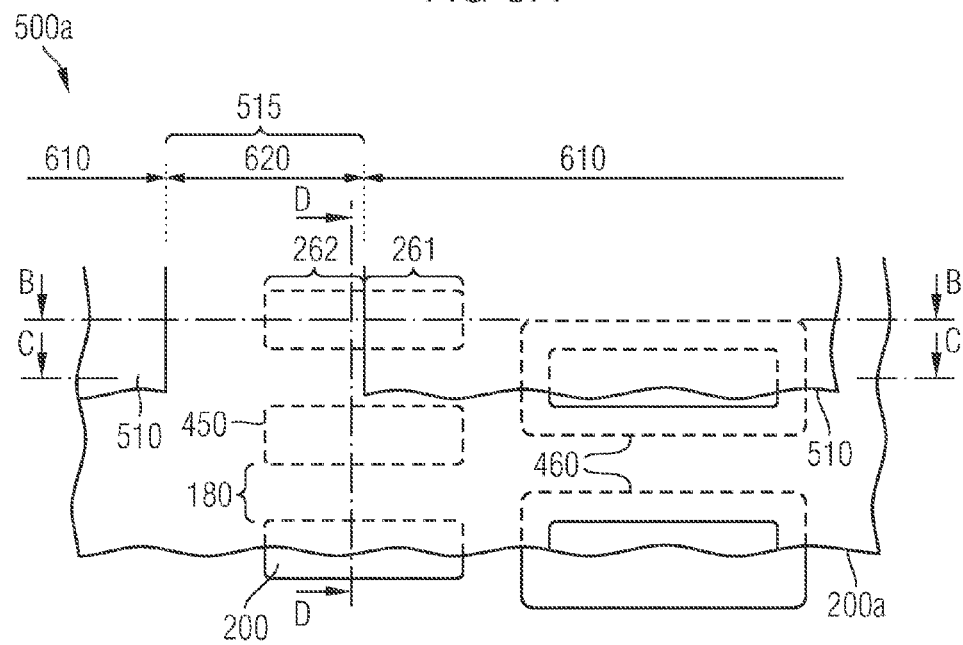
FIG. 5A is a schematic plan view of the semiconductor substrate portion of FIG. 4A after introducing impurities through openings of a first mask.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", an and the are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A-1C and FIGS. 2A-2C illustrate a sequence of processes providing drain zones self-aligned to a gate electrode. The term "self-aligned" indicates that the position of the drain zones in relation to the gate electrodes and gate dielectrics is not subject to a possible misalignment between two or more photolithographic masks. Instead, the position of the drain zones relative to the gate dielectrics is defined by well-controllable, non-photolithographic patterning processes.

A semiconductor substrate 500a consists of or contains a semiconductor layer 100a of a single-crystalline semiconductor material. The single-crystalline semiconductor material may be silicon Si, silicon carbide SiC, germanium Ge, a silicon germanium crystal SiGe, gallium nitride GaN or gallium arsenide GaAs, by way of example. According to an embodiment, the semiconductor substrate 500a may be a silicon wafer. According to another embodiment, the semiconductor substrate 500a is an SOI (silicon-on-insulator) wafer, e.g. an SOG (silicon-on-glass) wafer, with the semiconductor layer 100a disposed on an insulator substrate. The semiconductor layer 100a may be grown by epitaxy at least in parts and may include two or more sub-layers of a first conductivity type differing in a mean impurity concentration. The semiconductor substrate 500a may include further semiconductor and dielectric layers in addition to the semiconductor layer 100a.

The semiconductor layer 100a has a planar first surface 101 and a planar second surface 102 parallel to the first surface 101. A normal to the first and second surfaces 101, 102 defines a vertical direction and directions orthogonal to the vertical direction are lateral directions.

Dielectric stripe structures 200 extend from the first surface 101 into the semiconductor layer 100a. The dielectric stripe structures 200 may be arranged at a regular center-to-center distance (pitch). Regions of the semiconductor layer 100a between neighboring dielectric stripe structures 200 form semiconductor fins 180. The longitudinal axes of the dielectric stripe structures 200 define a first lateral direction. The dielectric stripe structures 200 may consist of one single material or may have a layered structure of two or more sub-layers of different dielectric materials including semiconductor oxides, e.g. silicon oxide, silicon oxynitride, silicon oxide based on TEOS (tetraethyl orthosilicate) or thermally grown silicon oxide. According to an embodiment, the dielectric stripe structures 200 have an approximately homogeneous structure.

In addition, further dielectric stripe structures 201 may extend from the first surface 101 into the semiconductor layer 100a, wherein the longitudinal axes of the further dielectric stripe structures 201 are parallel to the first lateral direction. The further dielectric stripe structures 201 may be regularly arranged at a regular pitch which may be the same as the pitch of the dielectric stripe structures 200. According to other embodiments, the pitch of the further dielectric stripe structures 201 may be greater than the pitch of the dielectric stripe structures 200. The further dielectric stripe structures 201 may be spaced from the dielectric stripe structures 200 in the first lateral direction.

The further dielectric stripe structures 201 may be partially or completely filled with dielectric and/or conductive materials. According to an embodiment, each further dielectric stripe structure 201 is lined with a layer of the material forming the dielectric stripe structures 200 and includes a void in a central portion.

A first mask layer is deposited and patterned by a photolithographic process to form a first mask 510. The first mask 510 covers at least a first area 610. The first area 610 includes first stripe sections 261 including first end portions of the dielectric stripe structures 200 oriented to the further dielectric stripe structures 201 as well as first fin sections 181 of the semiconductor fins 180 between the first strip sections 261. The first area 610 may include the further dielectric stripe structures 201 as well as portions of the semiconductor layer 100a between neighboring further dielectric stripe structures 201 and between the dielectric stripe structures 200 and the further dielectric stripe structures 201. An opening 515 in the first mask 510 exposes at least a second stripe section 262 of the dielectric stripe structures 200 and second fin sections 182 of the semiconductor fins 180 between the second stripe sections 262. The second area 620 directly adjoins to the first area 610.

According to the illustrated embodiment, the second stripe sections 262 include second end faces of the dielectric stripe structures 200 opposite to the first end faces. According to other embodiments, the first mask 510 may cover a third area including the second end faces of the dielectric stripe structures 200, wherein the second area 620 is between the first area 610 and the third area.

Using the first mask 510 as an impurity mask, e.g. as an implant mask, impurities 516 are introduced through the opening 515 into the second fin sections 182. The conductivity type of the implanted impurities 516 is complementary to the background impurity type of the semiconductor layer 100a. According to an embodiment, the background impurity type of the semiconductor layer 100a is the n type and the implanted impurities 516 are of the p type, e.g. boron B for a semiconductor layer 100a of silicon. For transistors of the enhancement type, the introduced impurities may counterdope the original background impurities to form body zones of a second, complementary conductivity type. For transistors of the depletion type, the introduced impurities may locally reduce the effective net impurity concentration to form channel zones of the first conductivity type. For example, multiple boron implants at different doses, energies and tilt angles may shape the channel/body zones 115a.

FIGS. 1A to 1C show p type provisional channel/body zones 115a formed by the implanted impurities 516 at least in the second fin sections 182. Apart from some impurity straddling immanent to the implantation process, the first fin sections 181 in substance remain unaffected and keep the original background impurity concentration.

An etch mask 510x is formed from the first mask 510. According to an embodiment the first mask 510 provides the etch mask 510x without being subjected to processes changing the contour of the opening 515. According to other embodiments, the first mask 510 is trimmed, wherein a lateral cross-sectional area of the opening 515 is increased by a predefined amount to form the etch mask 510x. For example, the first mask 510 may be subjected to an isotropic etch process and/or a thermal treatment or may be exposed to radiation or any other material-consuming or densifying process pulling back the lateral edges of the first mask 510 by a predefined amount. For example, the first mask 510 may be an amorphous or polycrystalline semiconductor material which may be subjected to an isotropic etch process. According to other embodiments, the first mask 510 may be a mask containing carbon which may be shrunk in a thermal process. The material of the first mask 510 may be a material which may be densified by thermal treatment, by exposure to radiation or by a chemical reaction in a gaseous or fluid ambient and against which the material of the dielectric stripe structure 200 can be etched with sufficient selectivity.

Using the original or trimmed first mask 510 as the etch mask 510x, the exposed portions of the dielectric stripe structures 200 are recessed. The etch may recess the material of the dielectric stripe structures 200 with high selectivity against the material of the semiconductor layer 100a. A gate dielectric 205 may be formed on exposed surfaces of the semiconductor fins 180.

FIGS. 2A to 2C show the etch mask 510x whose edge has been pulled back from the original edge of the untrimmed first mask 510 of FIGS. 1A to 1C by a drain extension length c. Recess grooves 150a extend from a plane spanned by the first surface 101 into the former dielectric stripe structures 200. Remnant portions of the dielectric stripe structures 200 below the trimmed first mask 510x may form first cell insulators 202a at the first end portions. Remnant portions of the dielectric stripe structures 200 below the recess grooves 150a may form second cell insulators 202b. The gate dielectric 205 covers top surfaces of the semiconductor fins 180 parallel to the first surface 101 and sidewalls of the semiconductor fins 180 tilted, e.g. perpendicular, to the first surface 101.

Third cell insulators 202c having a lateral width greater than the gate dielectric 205 may be provided at the second end faces of the former dielectric stripe structures 200. For example, the third cell insulators 202c may be remnant portions of the dielectric stripe structures 200 covered by a portion of the first mask 510 in a third area as described above. According to other embodiments, impurities may be implanted into the semiconductor material at the second end faces after forming the recess grooves 150a to exploit increased oxide growth on heavily doped substrates.

The drain extension length c can be reliably defined without an additional photolithographic mask and without considering mask alignment tolerances. The drain extension is an overlap between an active gate electrode provided in the recessed groove 150a and a drift zone 120 formed by a portion of the semiconductor layer 100a directly adjoining the provisional channel/body zones 115a along the first lateral direction and having the background impurity type as well as the background impurity concentration. The overlap ensures a reliable connection between an accumulation or inversion channel formed in the semiconductor fins 180 along the gate dielectrics 205 through channel/body zones emerging from the provisional channel/body zones 115a on the one hand and the drift zone 120 on the other hand. The thin gate dielectric 205 in the drain extension zone ensures a low parasitic gate-to-drain capacitance $C_{GD}$.

FIGS. 3A and 3B refer to a lateral power semiconductor device 500 with FinFET (fin field effect transistor) cells and exploiting field plate compensation. The illustrated embodiment refers to an n-channel IGFET (insulated gate field effect transistor), for example a p-channel MOSFET in the usual meaning including both gate electrodes containing metal as well as gate electrodes without metal, of the enhancement type. Equivalent considerations apply to p-channel IGFETs of the enhancement type as well as n-channel and p-channel IGFETs of the depletion type.

A semiconductor portion 100 of the semiconductor device 500 is based on a single-crystalline semiconductor material, for example silicon Si, silicon carbide SiC, germanium Ge, a silicon germanium crystal SiGe, silicon carbide SiC, gallium nitride GaN or gallium arsenide GaAs. A first surface 101 and an opposite second surface 102 of the semiconductor portion 100 are parallel to each other.

A plurality of parallel, buried cell stripes 350 extend from the first surface 101 into the semiconductor layer 100. The longitudinal axes of the buried cell stripes 350 extend parallel to a first lateral direction parallel to the first surface 101. The cell stripes 350 are regularly arranged adjacent to each other along a second lateral direction perpendicular to the first lateral direction at a regular pitch. The pitch of the cell stripes 350 may be between 100 nm and 1000 nm, e.g. between 200 nm and 500 nm. A width of the cell stripes 350 along the second lateral direction may be between 50 and 200 nm, by way of example.

Each cell stripe 350 includes a buried gate electrode 150 dielectrically insulated from the surrounding material of the semiconductor portion 100. A first cell insulator 202a dielectrically insulates the buried gate electrode 150 along the first lateral direction at a first end face of the cell stripe 350. A second cell insulator 202b dielectrically insulates the buried gate electrode 150 in the vertical direction. A third cell insulator 202c dielectrically insulates the buried gate electrode 150 in the first lateral direction at a second end face opposite to the first end face. Gate dielectrics 205 dielectrically insulate the buried gate electrodes 150 in the second lateral direction from semiconductor fins 180 formed from regions of the semiconductor portion 100 between the cell stripes 350. In addition, the gate dielectrics 205 cover a top surface of portions of the semiconductor fins 180 parallel to the first surface 101 and dielectrically insulate gate connection stripes 151 from the semiconductor fins 180.

Buried, parallel field plate stripes 360 are spaced from the cell stripes 350 along the first lateral direction and extend from the first surface 101 into the semiconductor layer 100. The longitudinal axes of the buried field plate stripes 360 are parallel to the first lateral direction and the lateral axes of the cell stripes 350. The field plate stripes 360 are arranged along the second lateral direction. The field plate stripes 360 may be arranged in a regular pattern at a regular pitch which may be equal to or greater than the pitch of the cell stripes 350. The field plate stripes 360 may have a width along the second lateral direction which is greater than the width of the cell stripes 350. Each field plate stripe 360 may include a buried field plate electrode 160 of a conductive material and a field dielectric 206 dielectrically insulating the field plate electrode 160 from the semiconductor material of the surrounding semiconductor layer 100. A field plate connection stripe 161 may electrically connect the field plate electrodes 160 with each other and a further terminal or an electric circuit, e.g. a source line.

The buried gate and field plate electrodes 150, 160 extending along the second lateral direction as well as the gate and field plate connection stripes 151, 161 may be provided from the same or from different conductive materials. According to an embodiment, the buried gate and field plate electrodes 150, 160 as well as the gate and field plate connection stripes 151, 161 may consist of or may contain a portion of heavily doped polycrystalline silicon. According to other embodiments, the buried gate and field plate electrodes 150, 160 as well as the gate and field plate connection stripes 151, 161 may include a metal containing portion.

The gate dielectric 205 may consist of or contain a semiconductor oxide layer, e.g. a thermally grown silicon oxide, a deposited silicon oxide layer, for example a silicon oxide using TEOS as precursor material, a silicon nitride layer or a silicon oxynitride layer. The field dielectric 206 as well as the first, second and third cell insulators 202a, 202b, 202c may be provided from the same or from different dielectric materials. For example they may consist of or contain a semiconductor oxide layer, e.g. a thermally grown silicon oxide, a deposited silicon oxide layer, a silicon nitride layer or a silicon oxynitride layer.

A dielectric structure 220 may directly adjoin the first surface 101. The dielectric structure 220 may consist of or contain a thermally grown semiconductor oxide layer, for example a silicon oxide layer, and one or more deposited layers, for example a deposited silicon oxide layer, or doped or undoped silicate glass. The gate connection stripes 151 fill openings in the dielectric structure 220 in the vertical projection of the buried gate electrodes 150. The field plate connection stripes 161 may fill openings in the dielectric structure 220 in the vertical projection of the buried field plate electrodes 160.

Buried contact stripes 370 extend through the dielectric structure 220 and into the semiconductor layer 100. The buried contact stripes 370 extend along the second lateral direction in a distance to the cell stripes 350 and in a distance to the field plate stripes 360. A buried contact stripe 370 neighboring the illustrated column of cell stripes 350 provides a source connection for the cell column including the column of cell stripes 350 and the column of field plate stripes 360. A buried contact stripe 370 neighboring the illustrated column of field plate stripes 360 provides a drain connection of the cell column. The buried contact stripes 370 may be shared between neighboring cell columns. For example, each two cell columns may be arranged mirror-inverted with respect to an intermediate buried contact stripe 370, wherein the intermediate buried contact stripe 370 may be effective as source connection or as drain connection for both cell columns. According to other embodiments the same buried contact stripe 370 may be effective as source connection for a first cell column and as drain connection for a second cell column.

The buried contact stripes 370 include one or more conductive materials. According to an embodiment, the buried contact stripes 370 include a barrier liner 371 along the interface with the semiconductor layer 100. The barrier liner 371 may have a thickness of 5 nm to 100 nm and may consist of or contain titanium Ti, titanium nitride TiN, tantalum Ta, or tantalum nitride TaN, by way of example. Each buried contact stripe 370 may further include a fill portion 372 at least partially filling the cross-sectional area of the contact stripe 370 within the barrier liner 371. The material of the fill portion 372 may be tungsten W, by way of example.

Contact plugs 305 in an interlayer dielectric 230 on the dielectric structure 220 may electrically connect the buried contact structures 370 as well as the gate and field plate connection stripes 151, 161 with further structures of electric circuits integrated in the semiconductor device 500 or with terminal pads. A substrate electrode 390 may directly adjoin the second surface 102.

For the illustrated embodiment related to an n-IFGET of the enhancement type, the semiconductor portion 100 may have an n-type background doping with an impurity concentration between $1 \times 10^{13}$ cm$^{-3}$ and $1 \times 10^{16}$ cm$^{-3}$, by way of example.

P type or weakly doped n-type channel/body zones 115 are formed in the semiconductor fins 180 between neighboring cell stripes 350. An overlap between the buried gate electrodes 150 and the gate dielectrics 205 on the one side and an n type drift zone 120 at the other side defines a drain extension length c.

On both sides of the buried contact stripes 370 heavily doped source contact zones 111 and drain contact zones 130 provide a low ohmic connection between the drift zone 120 and the corresponding buried contact stripe 370 as well as between a source zone 110 and the corresponding buried contact stripe 370, wherein the source zone 110 extends between the heavily doped source contact zone 111 and the channel/body zones 115. Between the source zones 110 and the channel/body zones 115 a junction, e.g. a pn junction in the case of enhancement-type FET cells or an nn-junction in the case of depletion-type FET cells, is approximately aligned or self-aligned with a corresponding edge of the gate dielectrics 205 and the buried gate electrodes 150. A buried heavily doped p type contact zone 117 directly adjoining a bottom portion of the buried contact stripes 370 extends below the heavily doped source contact zone 111 and the source zone 110 and is structurally connected to a lower portion of the channel/body zones 115 below the cell stripes 350.

In the blocking mode, a suitable voltage applied to the buried field plate electrodes 160, for example the potential applied to the source zones 110, supports the depletion of the drift zone 120 and in combination with a long drift path between the channel/body zones 115 and the contact stripe 370 on the right hand side providing the drain connection ensures a high blocking voltage capability. In the on-state of enhancement-type FET cells, a suitable voltage applied to the gate electrodes 150 generates inversion channels of minority charge carriers in the channel/body zones 115 along the gate dielectrics 205 between the source zone 110 and the drift zone 120. In the off-state of depletion-type FET cells, a suitable voltage applied to the gate electrodes 150 depletes the channel/body zones 115 between the source zone 110 and the drift zone 120.

The self-aligned and well-defined drain extension with the length c, which may range from 0 to several nm, provides a low and uniform gate-to-drain capacitance $C_{gd}$ and a sufficient punch-through of the gate potential into the channel/body zones 115. In addition, the straddle of the implant introducing the impurities of the channel/body zones 115 can be compensated for. Self-aligning the junction between the source zones 110 and the channel/body zones 115 on the one hand and the corresponding edge of the gate dielectrics 205 and gate electrodes 150 on the other hand reduces intra-chip and inter-chip fluctuations of the gate-to-source capacitance $C_{gs}$.

FIGS. 4A to 11B illustrate a method of manufacturing a semiconductor device with a self-aligned junction between channel/body zone and drain zone according to an embodiment including a thermal growth of a cell insulator spatially separating the gate electrode from a source zone.

Referring to FIGS. 4A to 4D a semiconductor substrate 500a is provided that includes a semiconductor layer 100a from a single-crystalline semiconductor material. For example, a first epitaxial layer 191 may be grown on an underlayer in a thickness of 2 μm and 10 μm, for example at least 4 μm and at most 6 μm. The first epitaxial layer 191 may be in-situ doped. For example, the first epitaxial layer 191 may contain impurities of a first conductivity type, wherein the impurity concentration may be between $1\times10^{14}$ cm$^{-3}$ and $1\times10^{16}$ cm$^{-3}$, for example at least $5\times10^{14}$ cm$^{-3}$ and at most $5\times10^{15}$ cm$^{-3}$.

Spatially separated heavily doped contact zones 117 of the second conductivity type may be formed along a process surface of the first epitaxial layer 191, for example by a deep implant process. A second epitaxial layer 192 of the first conductivity type may be grown by epitaxy on the process surface of the first epitaxial layer 191 in a thickness of 1 μm and 3 μm, for example at least 1.3 μm and at most 2 μm. The second epitaxial layer 192 may be in-situ doped and may contain impurities of the first conductivity type in a concentration which may be at least ten times the impurity concentration in the first epitaxial layer 191. For example, the impurity concentration in the second epitaxial layer 192 may be between $1\times10^{16}$ cm$^{-3}$ and $1\times10^{18}$ cm$^{-3}$, for example at least $5\times10^{16}$ cm$^{-3}$ and at most $2\times10^{17}$ cm$^{-3}$. The first and second epitaxial layers 191, 192 including the contact zones 117 form a semiconductor layer 100a mainly consisting of single-crystalline semiconductor material, for example single-crystalline silicon Si, germanium Ge, a silicon germanium crystal SiGe, or others.

The illustrated embodiment refers to n-type FET cells with the first conductivity type being the n-type. Equivalent considerations apply to p-type FET cells with the first conductivity type being the p-type.

A hard mask material against which the semiconductor material of the semiconductor layer 100a can be etched with high selectivity may be deposited on a first surface 101 of the semiconductor layer 100a and may be patterned by a photolithographic process to form a trench mask. The hard mask layer may include an oxide layer with a thickness of 400 to 600 nm, a carbon layer with a thickness of 250 to 350 nm and a silicon oxynitride layer with a thickness of 40 to 60 nm. Mask openings of the trench mask correspond to cell and field plate stripes. Using the trench mask, cell and field plate trenches 450, 460 may be etched from the first surface 101 into the semiconductor layer 100a. A conformal dielectric layer 200a is formed on the resulting patterned surface.

FIG. 4A shows the cell trenches 450 arranged parallel to each other at a regular pitch. The longitudinal axes of the cell trenches 450 define a first lateral direction parallel to the first surface 101. Portions of the semiconductor layer 100a between neighboring cell trenches 450 form semiconductor fins 180. A pitch of the cell trenches 450 may range from 100 nm to 1 μm. A width of the cell trenches 450 along a second lateral direction orthogonal to the first lateral direction may be range from 40 to 500 nm. The cell trenches 450 are arranged in a column extending along a second lateral direction orthogonal to the first lateral direction.

A plurality of parallel field plate trenches 460 are formed in a distance to the cell trenches 450 with respect to the first lateral direction. A width of the field plate trenches 460 along the second lateral direction may be greater than the width of the cell trenches 450. A pitch of the field plate trenches 460 may be the same or may be greater than the pitch of the cell trenches 450.

FIG. 4B shows dielectric stripe structures 200 formed by the cell trenches 450 completely filled with the conformal dielectric layer 200a. The conformal dielectric layer 200a may be a homogenous layer or may contain two or more sub-layers including, e.g., a thermally grown silicon oxide and an LPTEOS (low-pressure TEOS) layer provided in a low-pressure deposition process using TEOS as precursor material.

FIG. 4C shows further dielectric stripe structures 201 formed from the field plate trenches 460 partially filled with the conformal dielectric layer 200a. The conformal dielectric layer 200a does not fill the field plate trenches 460 completely and leaves a void in the center of the respective field plate trench 460.

In FIG. 4D the semiconductor fins 180 are alternately arranged with the dielectric stripe structures 200 along the second lateral direction. The cell trenches 450 may reach or may extend into the buried contact zones 117.

A first mask layer may be deposited on the conformal dielectric layer 200a. The first mask layer may include a main mask layer 511 against which the materials of the conformal dielectric layer 200a and the semiconductor material of the semiconductor layer 100a can be etched with high selectivity. For example, the main mask layer 511 is a carbon layer. The first mask layer may include a transfer layer 519, which may transfer the pattern from a photoresist layer into the main mask layer 511. For example, the transfer layer 519 may be a silicon oxynitride layer or an amorphous silicon layer.

A second photolithographic process patterns the first mask layer to obtain a first mask 510 covering a first area 610 and including an opening 515 exposing a second area 620. The first area 610 includes first stripe sections 261 of the dielectric stripe structures 200 and may include the further dielectric stripe structures 201 as well as first fin sections 181 of the semiconductor fins 180 between the first stripe sections 261. The second area 620 includes second stripe sections 262 directly adjoining the first stripe sections 261, respectively, and second fins sections 182 between the second stripe sections 262. Remnants of a photoresist applied on the first mask layer may be removed after transferring the pattern of the photoresist into the transfer layer 519.

Using the first mask 510 as an implant mask, impurities 516 of the second conductivity type are introduced from the first surface 101 into the second fin sections 182 and into further portions of the semiconductor layer 100a directly adjoining the second fin portions 182 at a side of the cell trenches 450 opposite to the field plate trenches 460. The implant may include several steps, e.g. at least three or five steps, that may differ from each other in at least one of implant energy level, implant dose and implant angle, wherein the latter may vary, e.g., in a range from 3 degree to 7 degree with respect to the vertical direction. According to embodiments related to FET cells of the enhancement type, the implanted impurities may counter-dope the background doping of the first conductivity type for providing provisional body zones of the second conductivity type. As regards embodiments related to depletion type FET cells, the implanted impurities 516 may locally reduce the in-situ impurity concentration in the second epitaxial layer 192 to generate provisional channel zones.

Figure 5B:
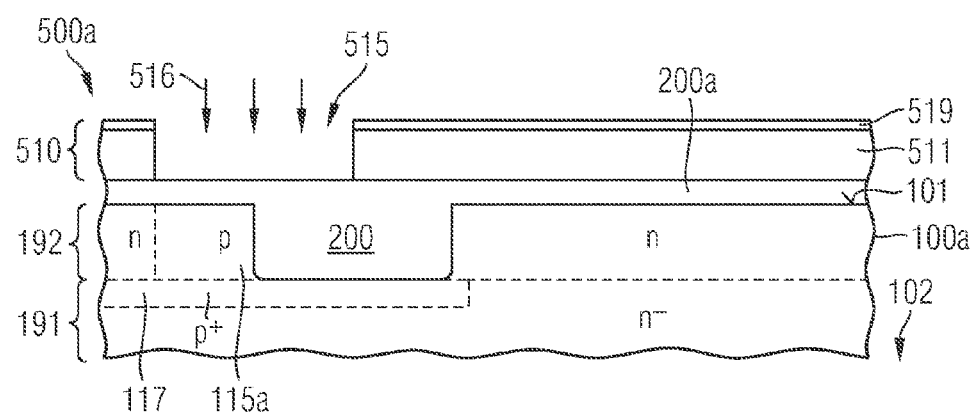
FIG. 5B is a schematic cross-sectional view of the semiconductor substrate portion of FIG. 5A along line B-B.

FIG. 5B shows the provisional channel/body zones 115a emerging from counter-doping the in-situ doped impurities of the first conductivity type below the mask openings 515.

The provisional channel/body zones 115a may be structurally connected with the buried contact zone 117.

Figure 5C:
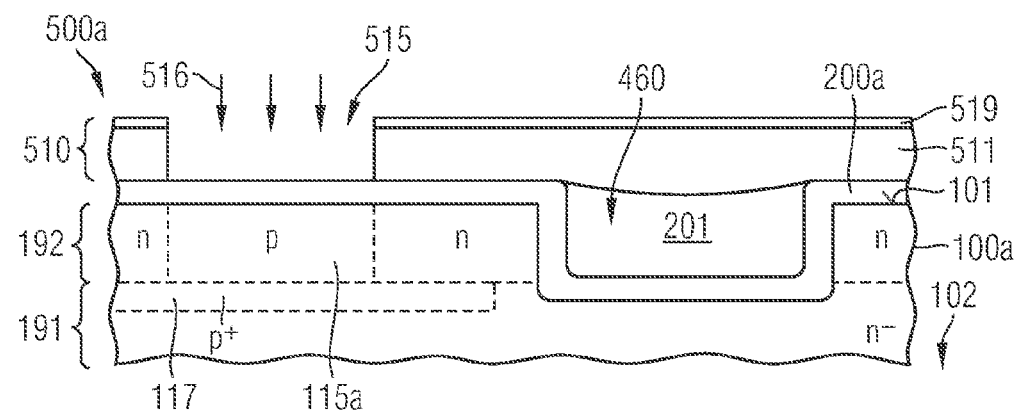
FIG. 5C is a schematic cross-sectional view of the semiconductor substrate portion of FIG. 5A along line C-C.
Figure 5D:
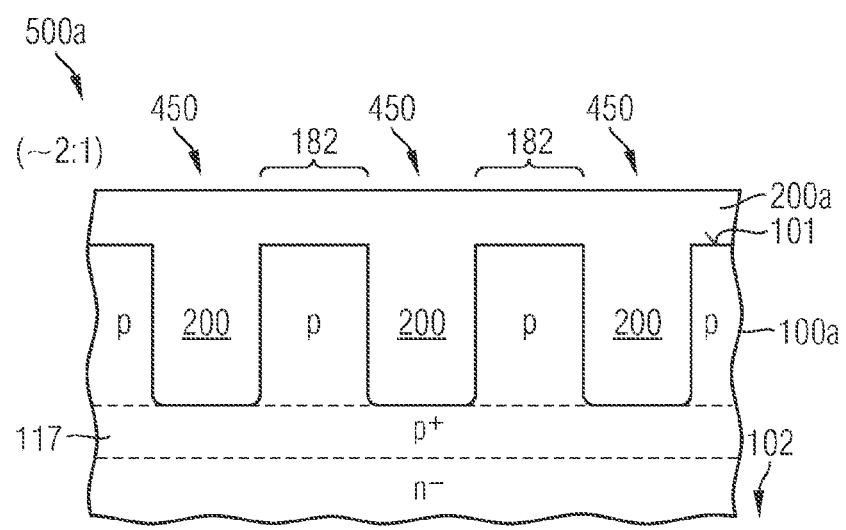
FIG. 5D is a schematic cross-sectional view of the semiconductor substrate portion of FIG. 5A along line D-D.

FIGS. 5C and 5D show the first mask 510 covering the further dielectric stripe structures 201 and the counter-doped second fin sections 182 between the dielectric stripe structures 200. Remnants of the transfer layer 519 may be removed and the remaining main mask layer 511 of the first mask 510 may be trimmed (shrunk), for example by material densification or isotropic material consumption, e.g. by a chemical process like an isotropic etch process, an anneal, or by exposing the main mask layer 511 to radiation. Using the trimmed first mask as an etch mask 510x, recess grooves 150a are etched into exposed portions of the dielectric stripe structures 200.

Figure 6A:
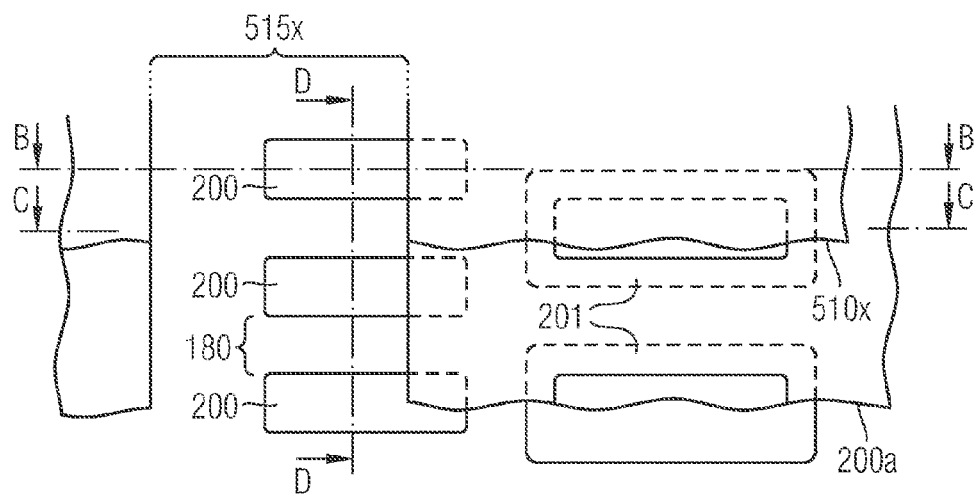
FIG. 6A is a schematic plan view of the semiconductor substrate portion of FIG. 5A after forming recess grooves in dielectric stripe structures using the trimmed first mask as an etch mask.

FIG. 6A shows the trimmed etch mask 510x whose outer edge defining widened opening 515x is pulled back by at least nm, e.g., at least 10 nm with respect to the corresponding edge of the first mask 510. According to an embodiment the pull back is in a range from 10 nm to 200 nm. The etch mask 510x still covers an end portion of the dielectric stripe structures 200 oriented to the further field plate trench 460. The widened opening 515x in the etch mask 510x exposes a greater portion of the dielectric stripe structures 200 than the first mask 510 before trimming.

Figure 6B:
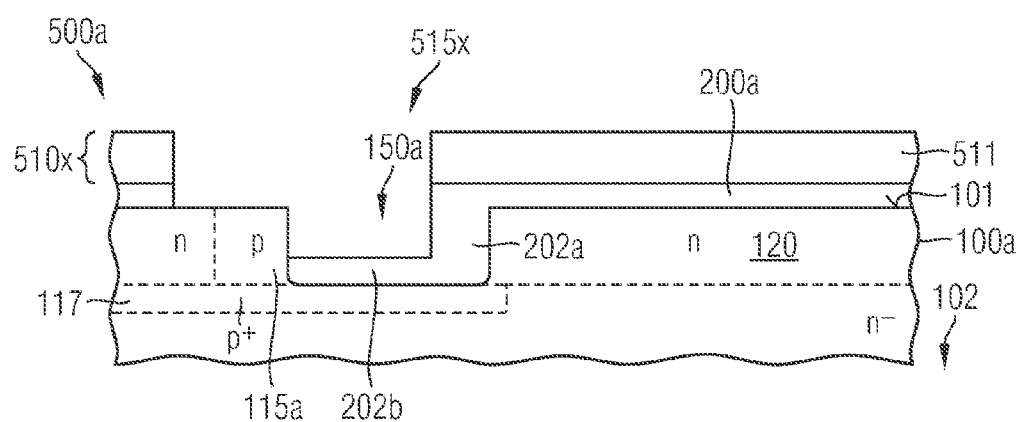
FIG. 6B is a schematic cross-sectional view of the semiconductor substrate portion of FIG. 6A along line B-B.

FIG. 6B shows the recess grooves 150a formed in a section of the dielectric stripe structure 200 exposed by the widened opening 515x of the etch mask 510x. A portion of the dielectric stripe structure 200 covered by the etch mask 510x forms a first cell insulator 202a in the end portion of the cell trench 450 oriented to the field plate trenches 460. A second cell insulator 202b is formed from a remnant portion of the dielectric stripe structure 200 in a lower portion of the cell trenches 450.

Figure 6C:
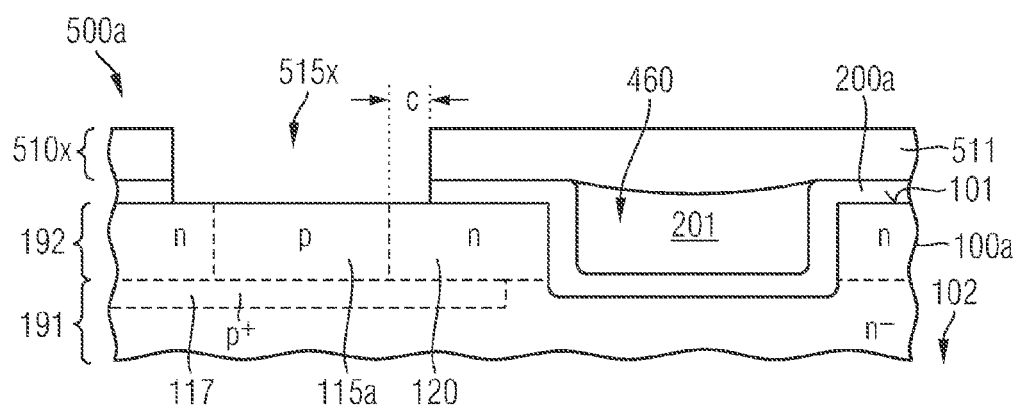
FIG. 6C is a schematic cross-sectional view of the semiconductor substrate portion of FIG. 6A along line C-C.

FIG. 6C shows a drain extension length c defined by the shrinkage between the first mask 510 of FIG. 5A and the etch mask 510x. The drain extension length is the overlap of a gate electrode formed in the recess groove 150a and a drift zone 120 formed form a non-counter-doped portion of the second epitaxial layer 192 adjoining to the provisional channel/body zones 115a in the first lateral direction.

Figure 6D:
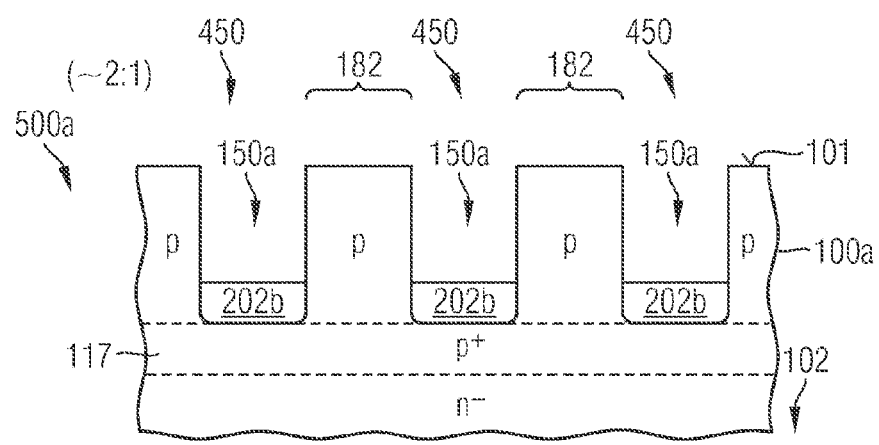
FIG. 6D is a schematic cross-sectional view of the semiconductor substrate portion of FIG. 6A along line D-D.

FIG. 6D shows the exposed portions of the semiconductor fins 180 between the recess grooves 150a.

Impurities 517 of the first conductivity type may be introduced into regions of the semiconductor portion 100 exposed at the end face of the recess grooves 150a after removing the etch mask 510x. For example, arsenic atoms As may be implanted at an implant angle α with respect to a normal to the first surface 101 and parallel to the first lateral direction, wherein the implant angle α is between 0° and 90°. In addition, non-doping atoms may be implanted at the same implant angle α and parallel to the first lateral direction, for example fluorine F and/or nitrogen N atoms.

Figure 7A:
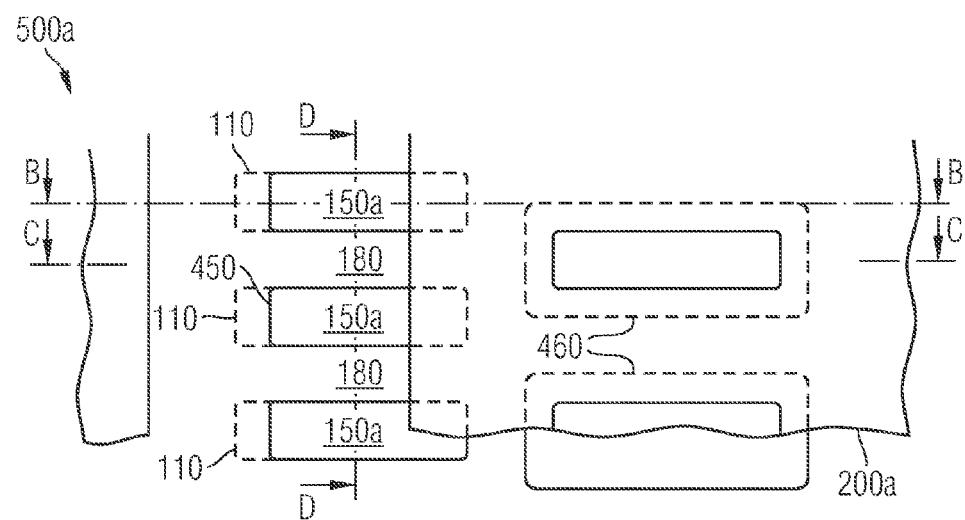
FIG. 7A is a schematic plan view of the semiconductor substrate portion of FIG. 6A after providing source zones.
Figure 7B:
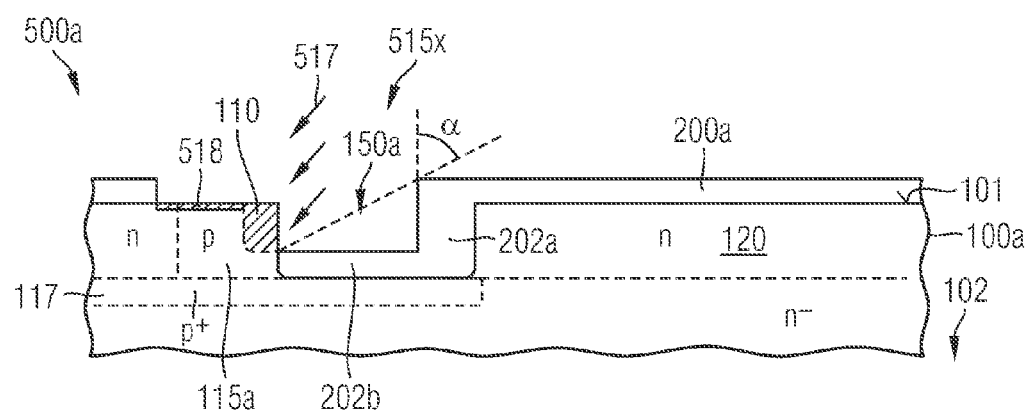
FIG. 7B is a schematic cross-sectional view of the semiconductor substrate portion of FIG. 7A along line B-B.

FIGS. 7A and 7B show source zones 110 of the first conductivity type resulting from the tilted implant 517.

Figure 7C:
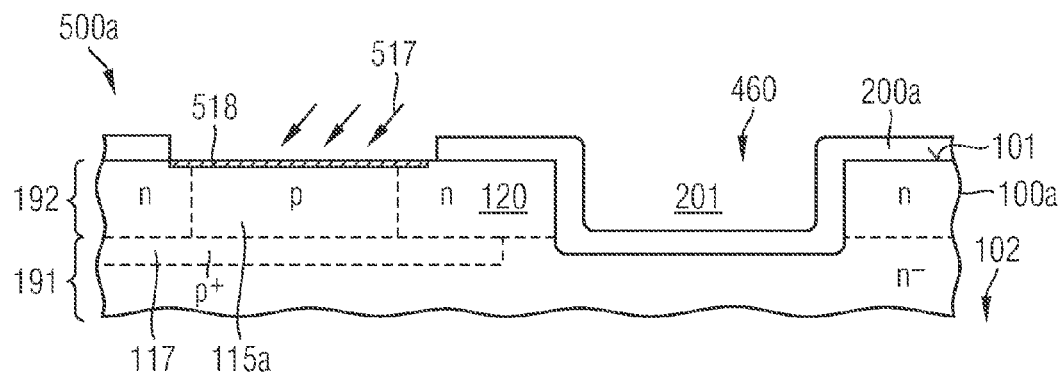
FIG. 7C is a schematic cross-sectional view of the semiconductor substrate portion of FIG. 7A along line C-C.
Figure 7D:
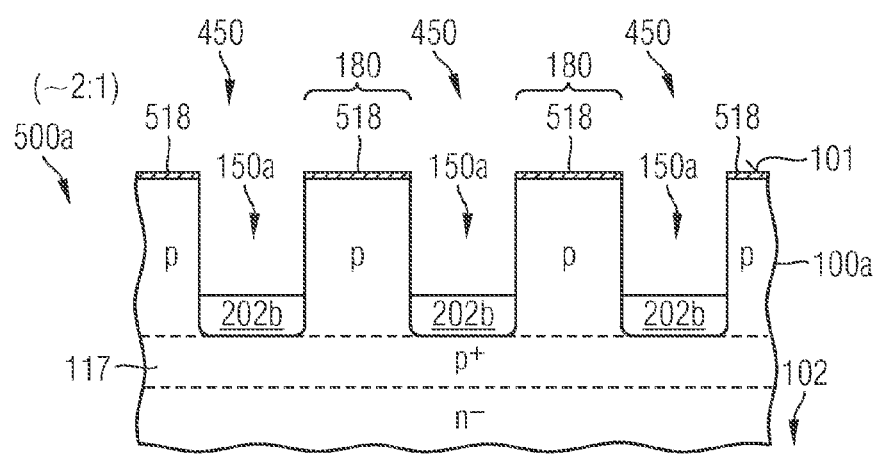
FIG. 7D is a schematic cross-sectional view of the semiconductor substrate portion of FIG. 7A along line D-D.

As illustrated in FIGS. 7C and 7D impurity regions 518 may be formed along the first surface 101 in regions of the semiconductor portion 100 including the semiconductor fins 180 which are not covered by remnants of the conformal dielectric layer 200a. The impurity zones 518 may be removed using an anisotropic etch, by way of example. The semiconductor substrate 500a may be subjected to a cleaning process, for example by using DHF (diluted hydrofluoric acid). Exposed portions of the semiconductor fins 180 may be oxidized.

Figure 8A:
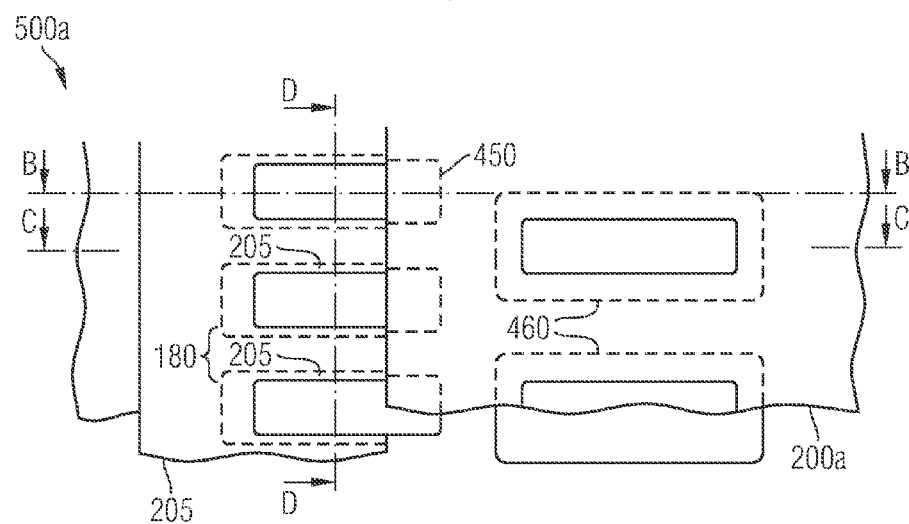
FIG. 8A is a schematic plan view of the semiconductor substrate portion of FIG. 7A after forming gate dielectrics.

FIG. 8A illustrates the grown gate dielectrics 205 formed on exposed regions of the semiconductor portion 100 including the semiconductor fins 180 which are not covered by remnants of the conformal dielectric layer 200a.

Since a high impurity concentration in the underlayer locally increases the oxide growth rate, a third cell insulator 202c formed at the exposed end face of the recess grooves 150a is significantly thicker than the gate dielectric 205 grown along the sidewalls and on top of the semiconductor fins 180.

Figure 8B:
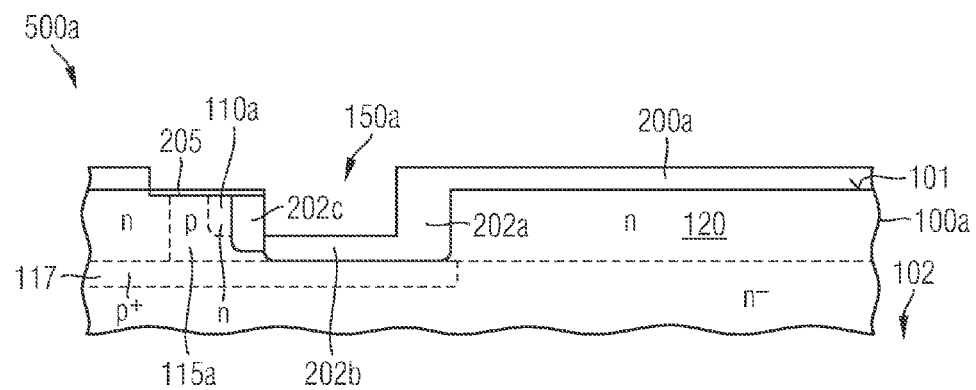
FIG. 8B is a schematic cross-sectional view of the semiconductor substrate portion of FIG. 8A along line B-B.
Figure 8C:
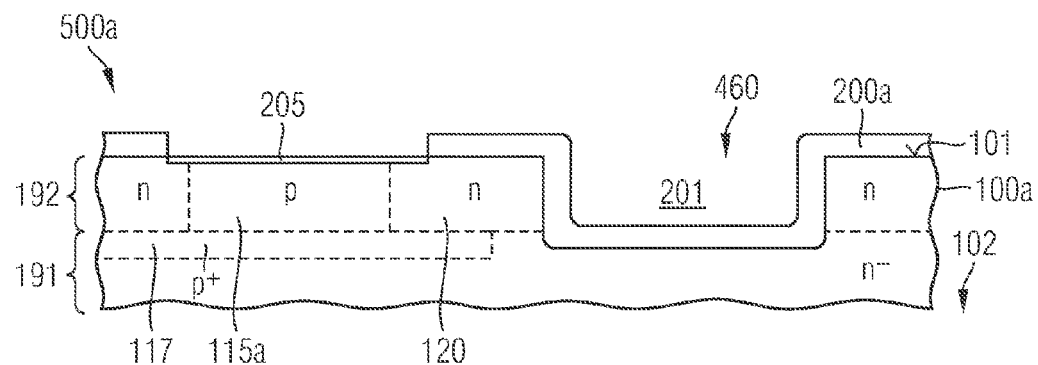
FIG. 8C is a schematic cross-sectional view of the semiconductor substrate portion of FIG. 8A along line C-C.

FIG. 8B shows the thick third cell insulator 202c and FIG. 8C shows the gate dielectric 205 grown on regions of the semiconductor portion 100 including the semiconductor fins 180 not covered by remnants of the conformal dielectric layer 200a.

Figure 8D:
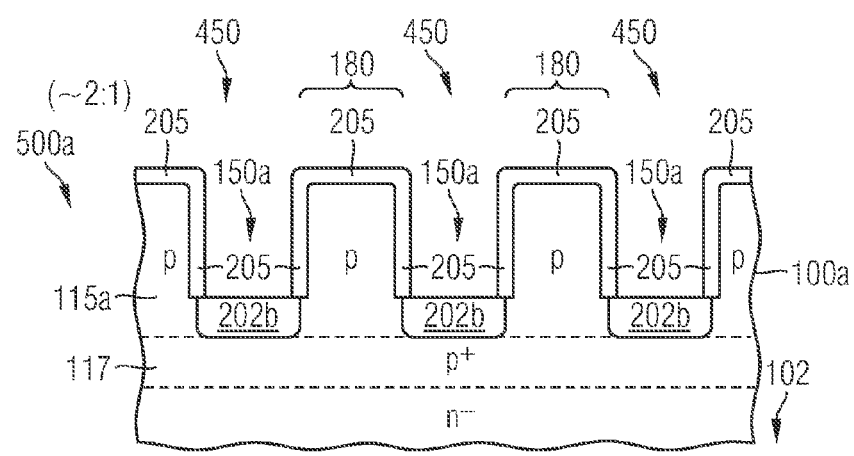
FIG. 8D is a schematic cross-sectional view of the semiconductor substrate portion of FIG. 8A along line D-D.

FIG. 8D shows the provisional channel/body zones 115a formed in portions of the semiconductor fins 180, wherein the gate dielectric 205 covers the semiconductor fins 180 along the two sidewalls tilted to the first surface 101 and along a top surface, which extends parallel to the first surface 101 and connects the two sidewalls.

One or more conductive materials may be deposited that fill the recess grooves 150a and the voids in the further dielectric stripe structures 201 and that cover portions of the conformal dielectric layer 200a and the grown gate dielectric 205. The conductive materials may be or may contain heavily doped polycrystalline silicon, for example heavily n type polycrystalline silicon. The deposited conductive material may be patterned by a photolithographic process to generate gate connection stripes 151 and field plate connection stripes 161.

FIG. 9A shows the spatially separated gate and field plate connection stripes 151, 161 extending along the second lateral direction and.

FIG. 9B shows a buried gate electrode 150 formed from a portion of the conductive material filling the recess grooves 150a of FIG. 8B. The gate connection stripes 151 structurally and electrically connect the buried gate electrodes 150 arranged along the second lateral direction and form active gate electrode portions above the semiconductor fins 180.

Figure 9C:
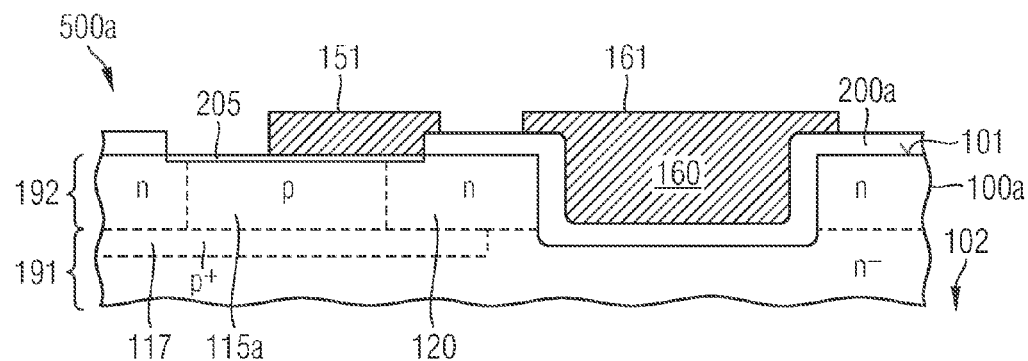
FIG. 9C is a schematic cross-sectional view of the semiconductor substrate portion of FIG. 9A along line C-C.

FIG. 9C shows portions of the conductive material filling the voids in the field stripe structures 201 forming buried field plate electrodes 160. A field plate connection stripe 161 may structurally and electrically connect buried field plate electrodes 160 arranged along the second lateral direction.

Figure 9D:
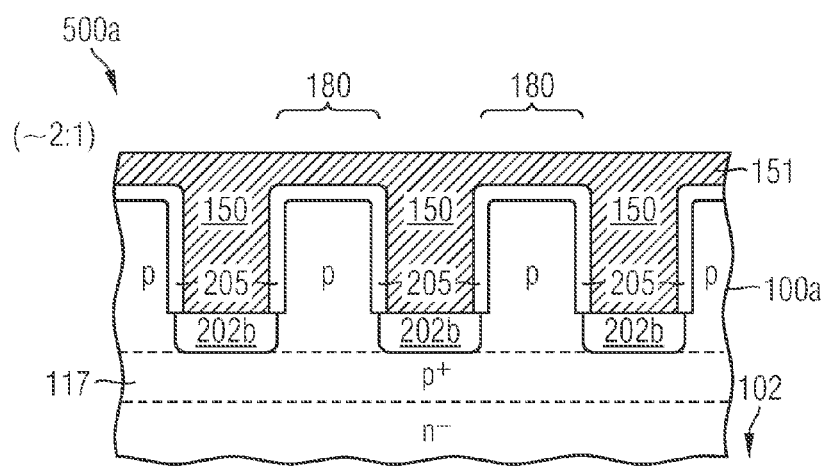
FIG. 9D is a schematic cross-sectional view of the semiconductor substrate portion of FIG. 9A along line D-D.

FIG. 9D shows a gate connection stripe 151 connecting the buried gate electrodes 150. In combination with the buried gate electrodes 150 the gate connection stripe 151 encloses portions of the semiconductor fins 180 on three sides.

A thermal oxidation process may be performed to passivate exposed surfaces of the gate and field plate connection stripes 151, 161. A conformal oxide spacer layer may be deposited and recessed using an anisotropic etch process to generate oxide spacers 210 along vertical sidewalls of the gate and field plate connection stripes 151, 161 as shown in FIGS. 10A-10C.

An interlayer dielectric 230, for example consisting of or containing a TEOS layer, may be deposited. Contact trenches 470 extending along the second lateral direction are introduced from an exposed surface of the interlayer dielectric 230 into the semiconductor layer 100a. The contact trenches 470 may reach the buried contact zones 170, may extend into the buried contact zones 170 or may cut through the buried contact zones 117. Impurities of the first conductivity type may be introduced into sections of the semiconductor layer 100a exposed by sidewalls of the contact trenches 470, e.g. by a diffusion process using outdiffusion from a sacrificial layer or a diffusion from a gaseous phase.

Impurities of the second conductivity type may be implanted through the bottom of the contact trenches 470 at least in sections of the contact trenches 470 along a lateral direction orthogonal to the cross-sectional plane.

Figure 11A:
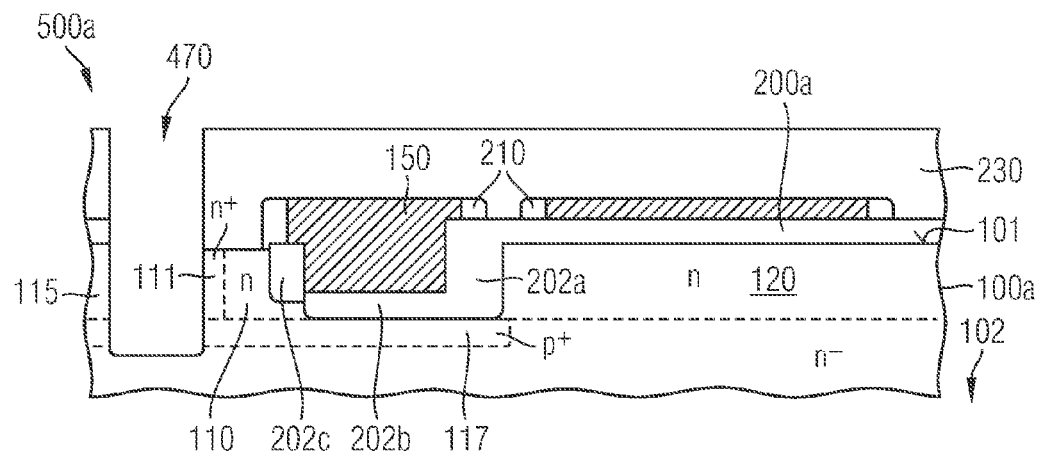
FIG. 11A is a schematic cross-sectional view of the semiconductor substrate portion of FIG. 10B after introducing contact trenches.
Figure 11B:
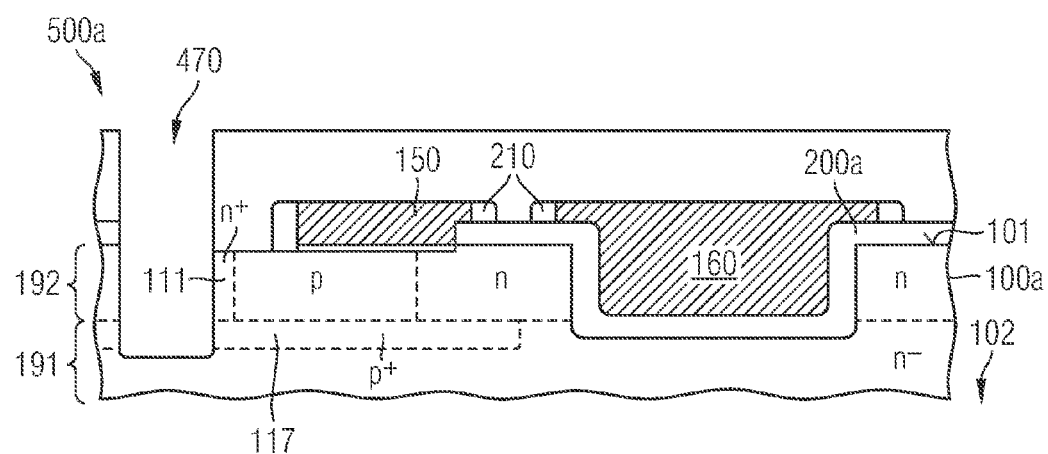
FIG. 11B is a schematic cross-sectional view of the semiconductor substrate portion of FIG. 10C after introducing contact trenches.

FIGS. 11A to 11B show contact zones 111, 130 resulting from introducing the impurities of the first conductivity type. The contact zones 111, 130 provide a low ohmic electric connection between contacts stripes subsequently formed in the contact trenches 470 and the source zones 110 formed between the contact and cell stripes as well as between the contact stripes and the drift zone 120.

Conductive materials may be deposited to provide contact stripes in the contact trenches 470. For example a barrier liner may be deposited to line the contact trenches 470. The barrier liner may consist of or contain titanium, titanium nitride, tantalum and/or tantalum nitride, by way of example. A fill portion of the contact stripes may contain or consist of tungsten W.

FIGS. 12A to 15D relate to a method providing a self-alignment of both drain and source zones to gate electrodes by combining the position information about the contact trenches and the body/channel zones in one mask.

A semiconductor substrate 500a with dielectric stripe structures 200, further dielectric stripe structures 201 and a conformal dielectric layer 200a may be provided as described with regard to FIGS. 4A to 4D.

Figure 12A:
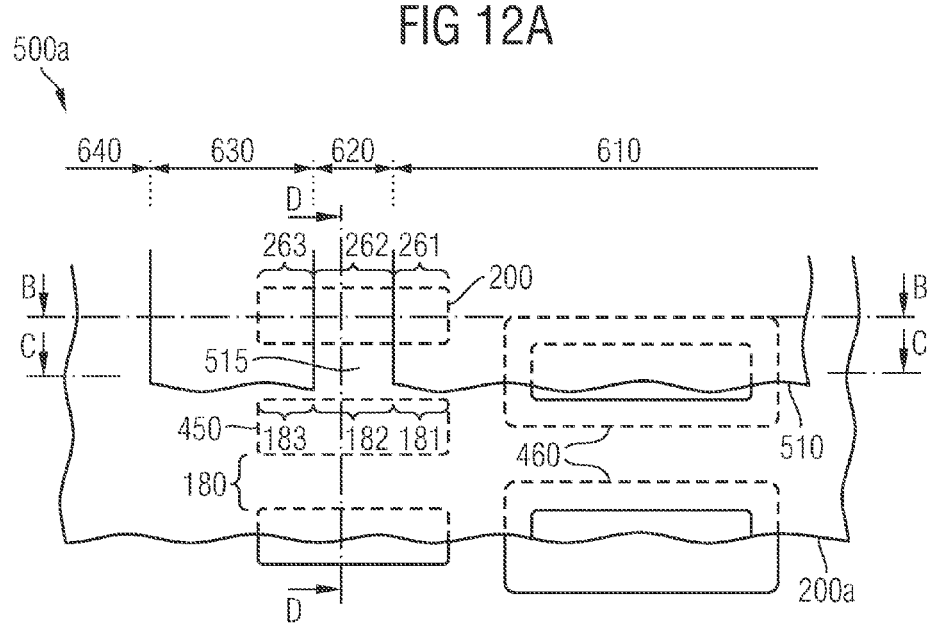
FIG. 12A is a schematic plan view of a portion of a semiconductor substrate for illustrating a method of manufacturing a semiconductor device with self-aligned source and drain zones by using a combined mask for defining both body/channel zones and contact stripes, after providing a first mask.

Other than the first mask 510 of FIGS. 5A to 5D, the first mask 510 shown in FIG. 12A covers a third area 630 including third stripe sections 263 comprising end portions of the dielectric stripe structure 200 opposite to the first end portions contained in the first area 610 as well as third fin sections 183 between the third stripe sections 263. The second stripe portions 262 and the second fin portions 182 included in the second area 620 are central portions of dielectric stripe structures 200 and the semiconductor fins 180 with reference to the first lateral direction between the first and third areas 261, 263. A fourth area 640 may be defined adjoining the third area 630, wherein the third area 630 separates the second and fourth areas 620, 640. The first mask 510 covers the first and third areas 610, 630 and openings 515 in the first mask 510 expose the second and fourth areas 620, 640. Impurities 516 of an impurity type complementary to a background doping of the semiconductor layer 100a are introduced through the openings 515.

Figure 12B:
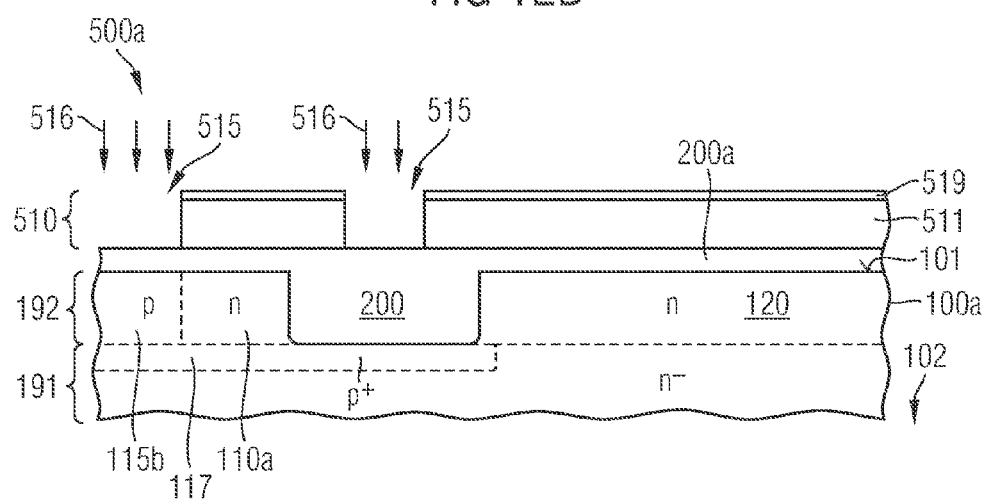
FIG. 12B is a schematic cross-sectional view of the semiconductor substrate portion of FIG. 12A along line B-B.

As shown in FIGS. 12B to 12D the introduced impurities form body/channel zones 115 in the second area 620 and doped zones 115b in the fourth area 640.

The first mask 510 may include a main mask layer 511 against which the material of the conformal dielectric layer 200a and the semiconductor material of the semiconductor layer 100a can be etched with high selectivity. According to an embodiment, the main mask layer 511 is a carbon layer. The first mask 510 may include a transfer layer 519 which may be, by way of example, a silicon oxynitride layer or an amorphous silicon layer. The first mask 510 may further include a resist mask portion bearing on the transfer layer 519, wherein the impurities 516 may be introduced, e.g. implanted, before stripping the resist mask. According to other embodiments, the main mask layer 511 is provided with a thickness which is sufficiently high to allow sufficiently deep boron B implants, wherein the impurities 516 are introduced without a resist mask portion.

After introducing the impurities 516, a possible resist mask portion may be stripped and the remaining hard mask may or may not be pulled back. Recess grooves 150a are formed in the dielectric stripe structures 200 by etching the material of the conformal dielectric layer 200a selectively against the semiconductor material of the semiconductor layer 100a and the first mask 510.

According to the illustrated embodiment, the openings 515 in FIGS. 13A to 13D approximately or completely correspond to the openings 515 of FIGS. 12A to 12D. According to other embodiments, the openings 515 in FIG. 13A to 13D may have a larger width along the first lateral direction than the mask openings 515 in FIGS. 12A to 12D.

In the openings 515, the anisotropic etch removes a portion of the conformal dielectric layer 200a in the fourth area 640 from the first surface 101. In the second areas 620 the anisotropic etch cuts through the conformal dielectric layer 200a above the dielectric stripe structures 200 and forms recess grooves 150a in the dielectric stripe structures 200. Further, the anisotropic etch removes portions of the conformal dielectric layer 200a from the central second fin sections 182 above the body/channel zones 115.

Figure 13A:
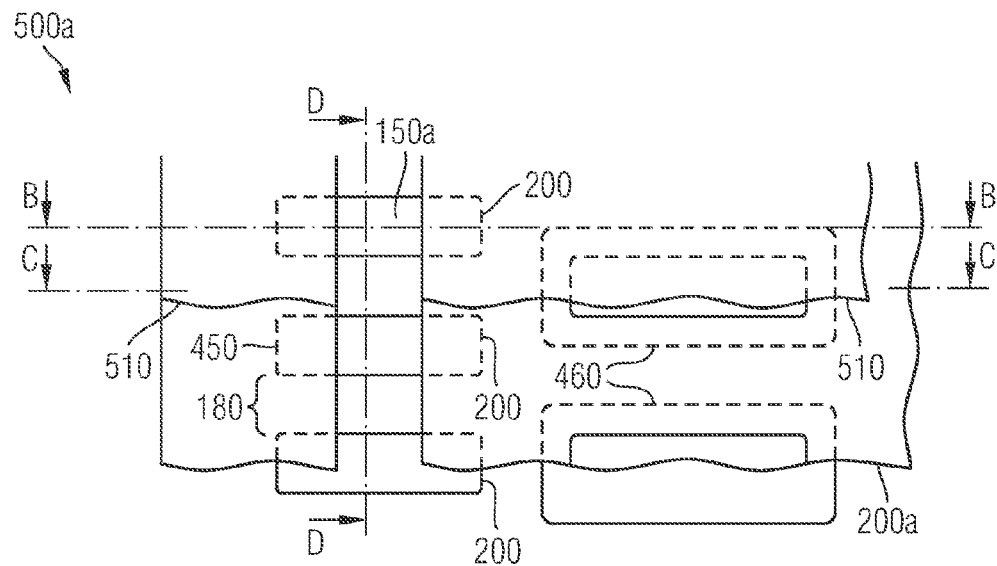
FIG. 13A is a schematic plan view of the semiconductor substrate portion of FIG. 12A after introducing recess grooves for gate electrodes.
Figure 13B:
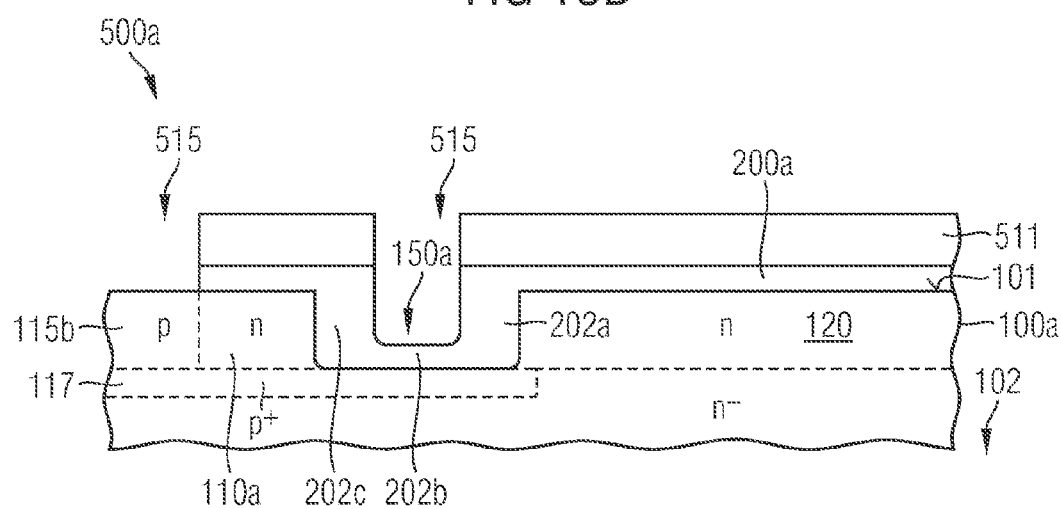
FIG. 13B is a schematic cross-sectional view of the semiconductor substrate portion of FIG. 13A along line B-B.

As regards FIG. 13B, remnant portions of the dielectric stripe structure 200 form a first cell insulator 202a in the first end portion, a second cell insulator 202b in the vertical direction of the recess groove 150a and a third cell insulator 202c in the second end portion.

Figure 13C:
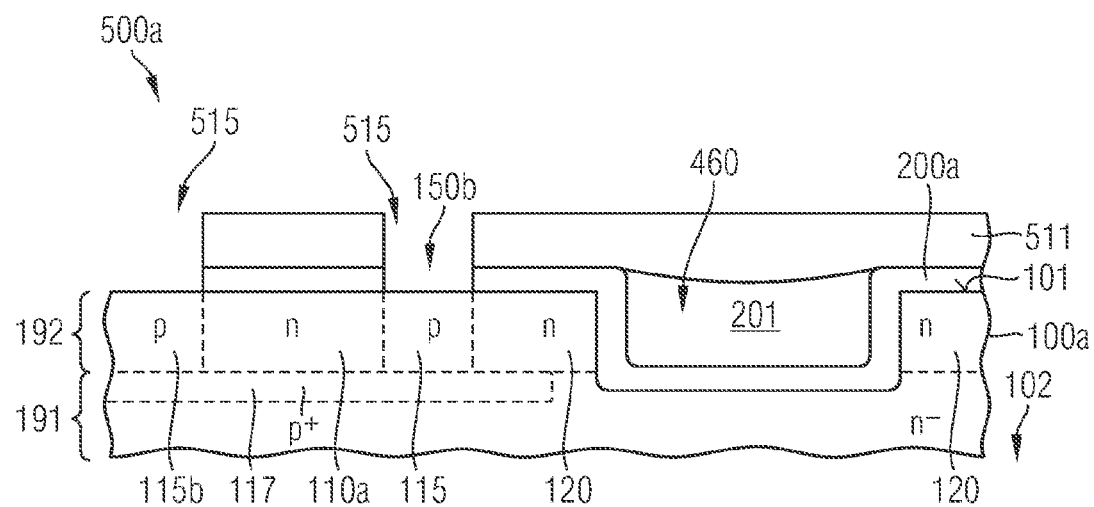
FIG. 13C is a schematic cross-sectional view of the semiconductor substrate portion of FIG. 13A along line C-C.
Figure 13D:
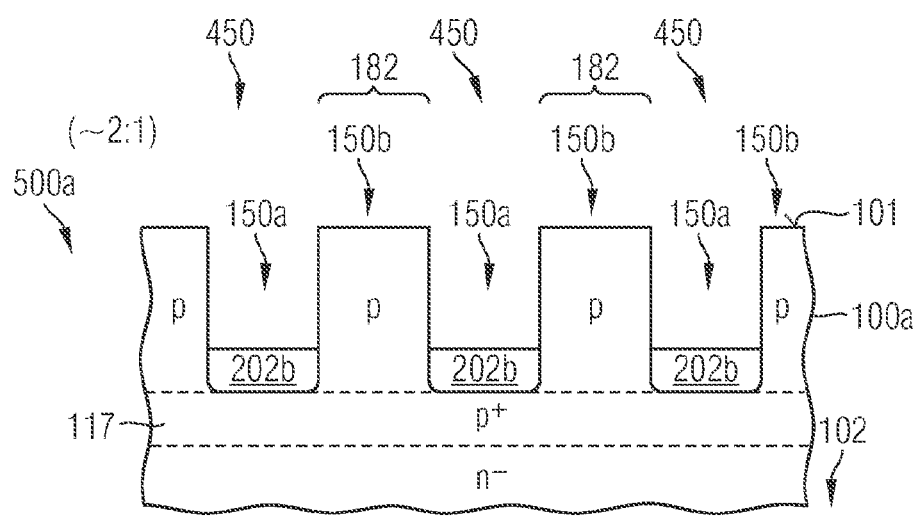
FIG. 13D is a schematic cross-sectional view of the semiconductor substrate portion of FIG. 13A along line D-D.
Figure 14A:
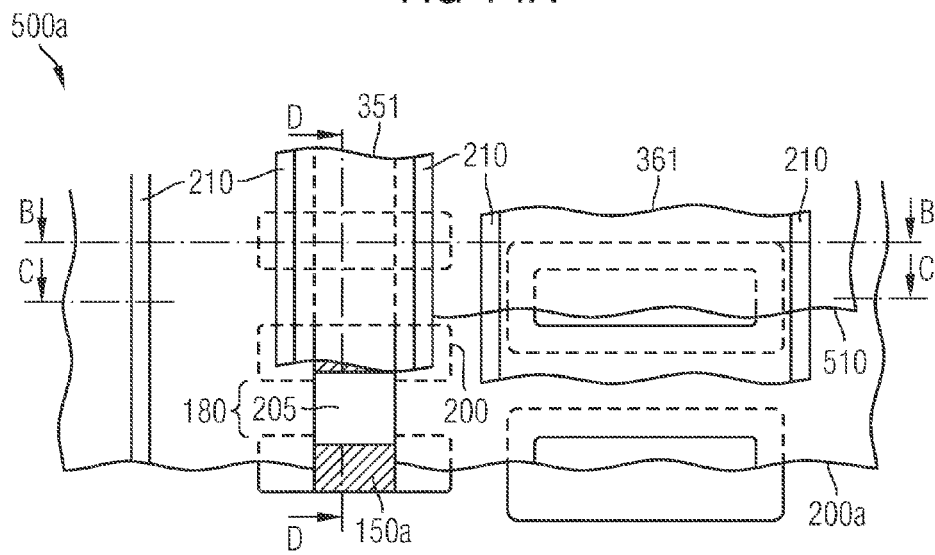
FIG. 14A is a schematic plan view of the semiconductor substrate portion of FIG. 13A after providing gate and field plate connection stripes.
Figure 14B:
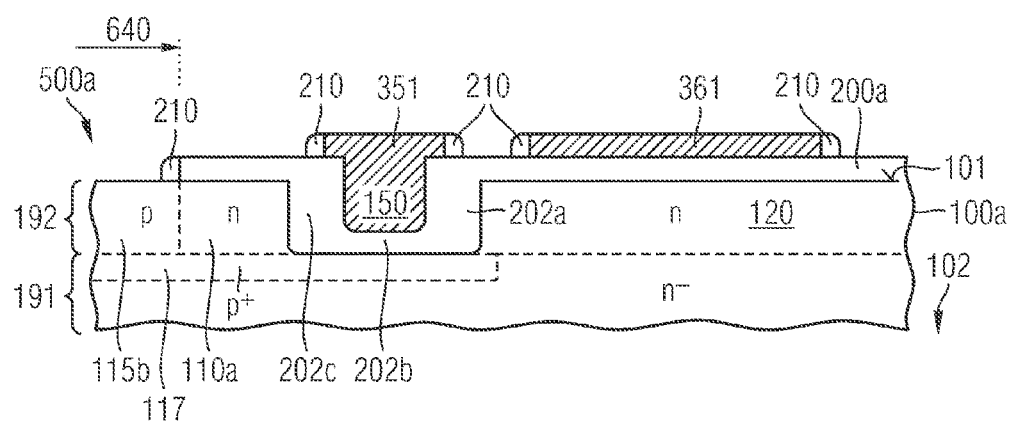
FIG. 14B is a schematic cross-sectional view of the semiconductor substrate portion of FIG. 14A along line B-B.
Figure 14C:
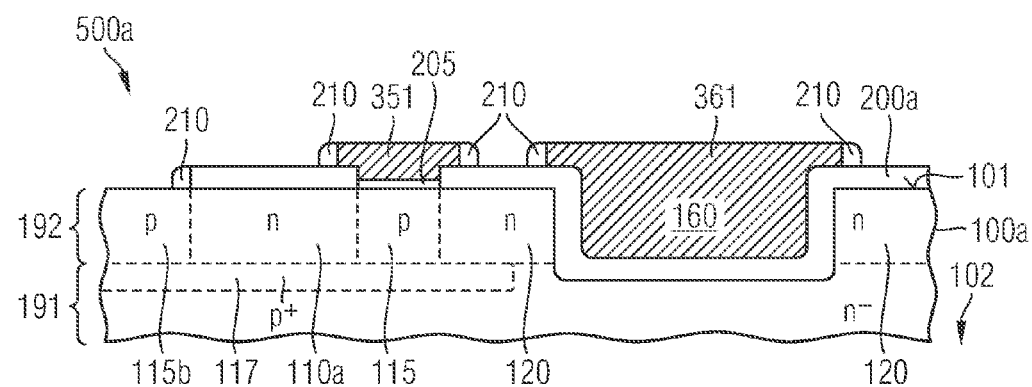
FIG. 14C is a schematic cross-sectional view of the semiconductor substrate portion of FIG. 14A along line C-C.
Figure 14D:
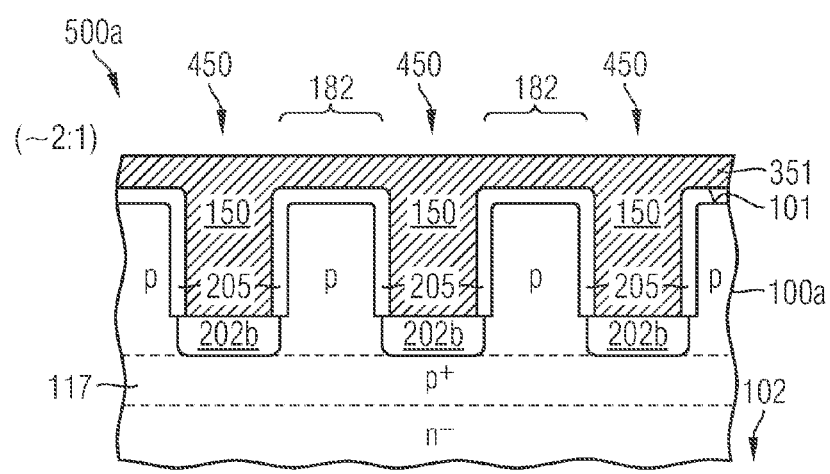
FIG. 14D is a schematic cross-sectional view of the semiconductor substrate portion of FIG. 14A along line D-D.

As illustrated in detail in FIGS. 13C and 13D, the central second portions 182 of the semiconductor fins 180 are exposed at a top surface parallel to the first surface 101 and at upper portions of fin sidewalls oriented to the first surface 101.

According to another embodiment, the order of etching as illustrated in FIGS. 13A to 13D and implanting as illustrated in FIGS. 12A to 12D is inversed allowing a trimming of the resist.

The selectivity of the oxide etch to the silicon etch may be 10:1, i.e. the removal rate of oxide is about ten times the removal rate of silicon. The high-selective etch allows a good oxide profile control. The semiconductor substrate 500a may be cleaned using DHF. Gate dielectrics 205 may be provided by thermal growth of silicon oxide on the exposed surfaces of the central second portions 182 of the semiconductor fins 180. A conductive material may be deposited and patterned by a photolithographic process and may be provided with oxide spacers 210. As regards the formation of the oxide spacers, reference is made to the description of FIGS. 9A to 10C.

FIGS. 14A to 14D insofar approximately correspond to FIGS. 10A to 10C and 9D. Apart from details of the third cell insulator 202c and dielectric structures above the first surface 101, the semiconductor substrate 500a of FIGS. 14A to 14D corresponds to that described in FIGS. 10A to 10C and 9D. The oxide spacer etch may also remove an oxide layer grown contemporaneously with the gate dielectric 205 in the fourth area 640 wherein the etch exposes a portion of the semiconductor layer 100a in the fourth area 640. The semiconductor substrate 500a may be cleaned using DHF and in the exposed portions of the semiconductor layer 100a in the fourth area 640, an anisotropic etch may remove silicon selectively against the material of the conformal dielectric layer 200a to form contact trenches 470 extending along the second lateral direction in place of the doped zones 115b. The positional information about the contact trenches 470 is taken from the same mask defining the position and size of the body/channel zones 115 and the gate dielectric 205 such that no mask alignment margins must be taken into consideration.

Impurities 519 of the first conductivity type may be introduced into the semiconductor layer 100a through the sidewalls of the contact trenches 470, e.g. by out diffusion from the gaseous phase or a sacrificial material, or implanted by an angled implant with an implant angle to the normal between 0 and 90° and parallel to the first lateral direction. The introduced impurities 519 may form heavily doped source contact zones 111 and heavily doped drain contact zones 130 extending parallel to the vertical sidewalls of the contact trenches 470.

Figure 15A:
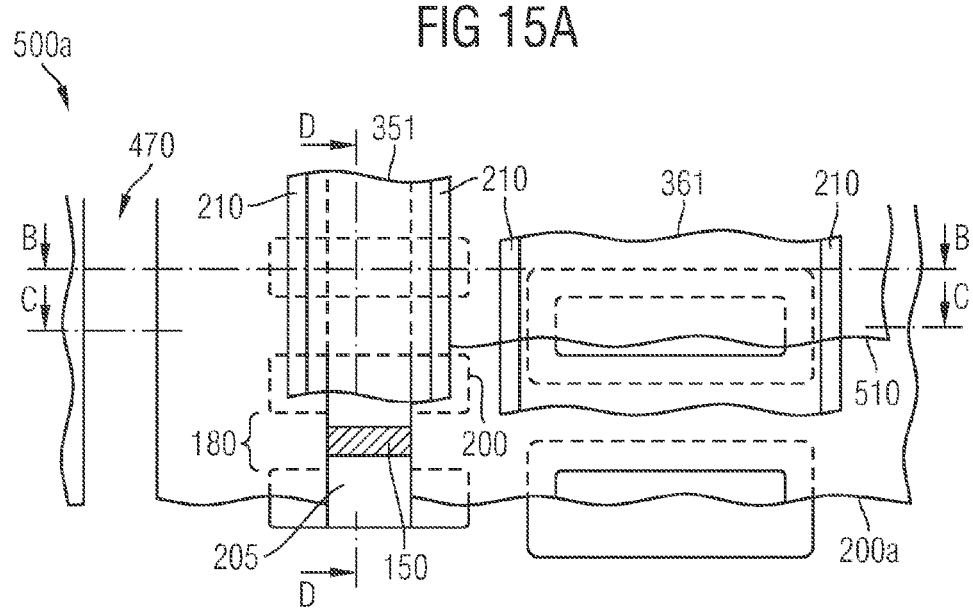
FIG. 15A is a schematic plan view of the semiconductor substrate portion of FIG. 14A after introducing contact trenches.
Figure 15B:
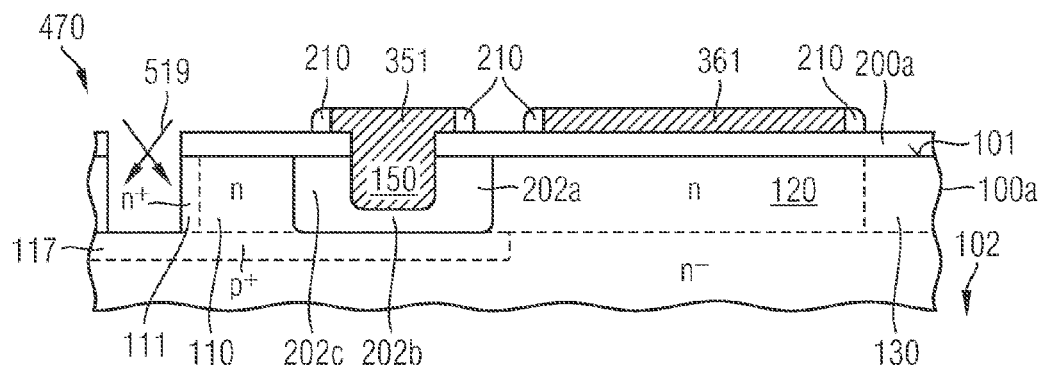
FIG. 15B is a schematic cross-sectional view of the semiconductor substrate portion of FIG. 15A along line B-B.
Figure 15C:
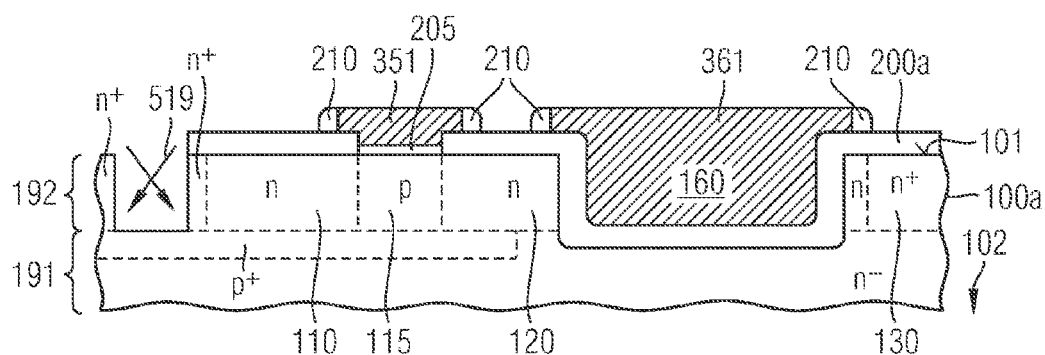
FIG. 15C is a schematic cross-sectional view of the semiconductor substrate portion of FIG. 15A along line C-C.

FIGS. 15A to 15C show the implanted source contact zones 111 and drain contact zones 130. Formation of contact stripes in the contact trenches 470 may follow as described with reference to FIGS. 11A to 11B.

FIGS. 16A to 16K relate to a further method facilitating self-alignment of both the source and drain zones to the gate electrodes in a transistor cell array including lateral FinFET cells with field plate electrodes.

A semiconductor substrate 500a includes a semiconductor layer 100a that may include a first epitaxial layer 191 and a second epitaxial layer 192 grown on the first epitaxial layer 191. The first and second epitaxial layers 191, 192 may have the same conductivity type, for example the n type. P type contact zones 117 may be formed in the first epitaxial layer 191 along the interface with the second epitaxial layer 192.

Using a single lithographic mask, cell trenches 450, field plate trenches 460 and contact trenches 470 are introduced from a first surface 101 of the semiconductor layer 100a into the semiconductor layer 100a. The cell trenches 450 are arranged parallel to each other and have longitudinal axes parallel to a first lateral direction. Portions of the semiconductor layer 100a between neighboring cell trenches 450 form semiconductor fins 180. The cell trenches 450 are arranged at regular pitches along a second lateral direction perpendicular to the first lateral direction. The field plate trenches 460 are arranged parallel to each other along the second lateral direction at a distance to the cell trenches 450. Longitudinal axes of the field plate trenches 460 are parallel to the first lateral direction. Contact trenches 470 extend along the second lateral direction, wherein a column of the cell trenches 450 and a column of the field plate trenches 460 are arranged between a pair of contact trenches 470. One column of cell trenches 450, one column of field plate trenches 460 and one contact trench 470 or one pair of contact trenches 470 may form a pattern which may repeat itself in the first lateral direction a plurality of times. Neighboring patterns may be arranged mirror-inverted with respect to a longitudinal axis of a shared contact trench 470. Since cell, field plate and contact trenches are defined by the same lithographic mask, many device parameters are not subject to mask alignment tolerances.

The cell trenches 450 may have a width w1 along the second lateral direction which is smaller than a width w2 of the field plate trenches 460 along the second lateral direction. A width w3 of the contact trenches 470 along the first lateral direction is greater than the width w1 of the cell trenches 450 and may be the same or may be wider than the width w2 of the field plate trenches 460. The pitch of the field plate trenches 460 may be the same or may be greater than a pitch of the cell trenches 450. As shown in the lower half of FIG. 16A, the field plate trenches 460 may have a greater vertical extension with regard to the first surface 101 of the semiconductor layer 100a than the cell trenches 450. The contact trenches 470 may have a greater vertical extension than the cell trenches 450 and the field plate trenches 460.

A highly conformal dielectric layer is provided that completely fills the cell trenches 450 but leaves open the contact trenches 470 and the field plate trenches 460. The conformal dielectric layer may have a thickness equal to or greater than half of the width w1 and smaller than half of the width w2.

The highly conformal dielectric layer may consist of a single homogenous layer or may include two or more sub-layers of different dielectric materials, e.g. deposited semiconductor oxide and thermally grown semiconductor oxide. According to an embodiment, the conformal dielectric layer is a TEOS layer having a thickness between 50 nm and 200 nm, for example at least 100 nm and at most 150 nm, e.g. 120 nm.

A sacrificial material is deposited that fills the remaining voids in the contact and field plate trenches 460, 470. The sacrificial material may be any material against which the materials of the semiconductor layer 100a and the conformal dielectric layer can be etched with high selectivity. According to an embodiment, the sacrificial material is carbon. The sacrificial material may be recessed with the surface of the conformal dielectric layer used as the end point of the recess. Contemporaneously with the carbon recess or subsequent to the carbon recess the conformal dielectric layer may be thinned to about a half of the original thickness or to at most 50 nm.

FIG. 16B shows sacrificial fills 461 of the field plate trenches 460 and the contact trenches 470 as well as the thinned conformal dielectric layer 200b covering the first surface 101.

In the cell trenches 450, portions of the conformal dielectric layer form dielectric stripe structures 200. Other portions of the conformal dielectric layer 200a line the field plate and contact trenches 460, 470. A photolithographic process patterns a first mask layer deposited on the conformal dielectric layer to form a first mask 510 with mask openings 515.

Figure 16C:
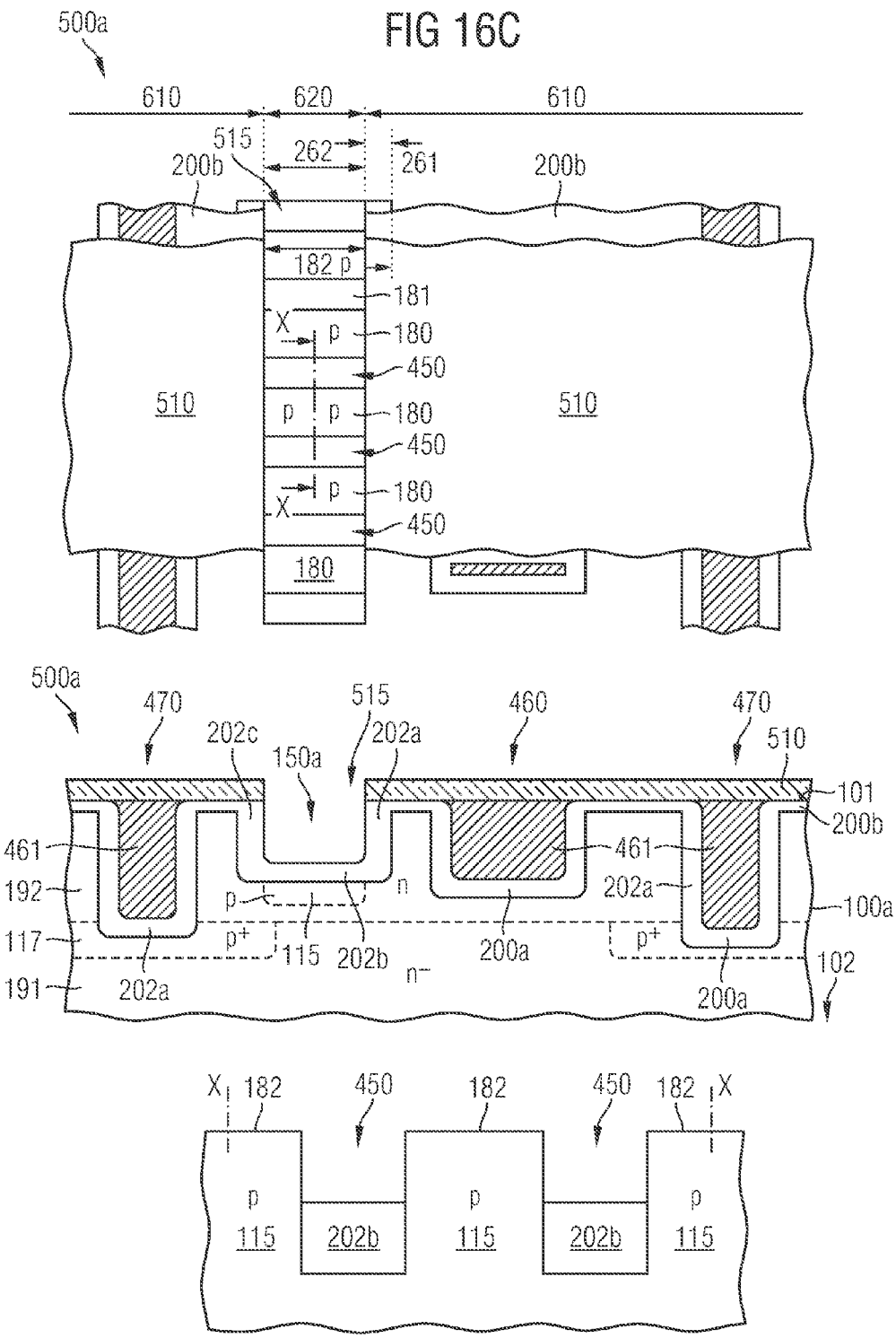
FIG. 16C shows a schematic plan view, a combined cross-sectional view along lines A-B and B-C as well as a cross-sectional view along line X-X of the semiconductor substrate portion of FIG. 16B after providing recess grooves and body/channel zones using a first mask.

In FIG. 16C the first mask 510 covers a first area 610 including first stripe sections 261 in first end portions of the dielectric stripe structures 200 as well as first fin sections 181 of the semiconductor fins 180 between the first stripe sections 261. The first area 610 further includes the field plate trenches 460 as well as portions of the semiconductor layer 100a between the field plate trenches 460, between the field plate trenches 460 and the dielectric stripe structures 200, the contact trenches 470, the area between the contact trenches 470 and the field plate trenches 460, and the area between the contact trenches 470 and the dielectric stripes structures 200. The openings 515 expose central second stripe portions 262 between the first and second end portions as well as second fin sections 182 between the second stripe sections 262.

P type impurities may be selectively introduced, e.g. implanted, through the openings 515 into the second fin portions 182 at different implantation energies. The implanted impurities may reduce the net impurity concentration of the background doping in the semiconductor layer 100a to form channel zones for depletion type transistors or may counter-dope the background doping to form p-type body zones for enhancement type transistors.

The first cross-sectional view in FIG. 16C shows that the resulting channel/body zones 115 may have a greater vertical extension than the dielectric stripe structures 200.

The first mask 510 may or may not be trimmed to widen the openings 515 along the first lateral direction. Then, the trimmed or not trimmed first mask 510 may be used as an etch mask to form recess grooves 150a in the dielectric stripe structures 200 as well as to remove exposed portions of the thinned conformal dielectric layer 200b on the second fin portions 182. Remnants of the dielectric stripe structure 200 form first cell insulators 202a in the first end portions, second cell insulators 202b below the recess grooves 150 and third cell insulators 202c in the second end portions.

As shown in the second cross-sectional view of FIG. 16C, the etch does not attack the semiconductor fins 180 such that the second fins sections 182 are exposed on a top side parallel to the first surface 101 and along upper sections of fin sidewalls oriented to the top surface, wherein the fin sidewalls are tilted, e.g. vertically tilted, to the first surface 101.

Remnants of the first mask 510 are removed. The sacrificial fills 461 may be removed selectively against the exposed silicon portions and the material of the thinned conformal dielectric layer 200b. For example, the sacrificial material is carbon and the carbon is removed via a carbon ash. A photolithographic process patterns a second mask layer deposited on the thinned conformal dielectric layer 200b to form a second mask 520 with openings 525 exposing the contact trenches 470 and covering the area between the contact trenches 470. The second mask 520 may be provided from amorphous silicon or polycrystalline silicon, by way of example. An etch process uses the second mask 520 as an etch mask and removes remnant portions of the conformal dielectric layer 200a from sidewalls of the contact trenches 470 as well as portions of the thinned conformal dielectric layer 200b on the first surface 101 directly adjoining the contact trenches 470.

The cross-sectional views of FIG. 16D show a second mask 520 based on an approximately conformal mask layer and covering approximately completely the area between neighboring contact trenches 470. According to another embodiment, the second mask 520 may be based on a highly non-conformal mask layer and may have an approximately planar surface.

Remnants of the second mask 520 are removed. A thermal oxidation process of the semiconductor material may form gate dielectrics 205 on the fin sidewalls and on the top surface of the second fin portions 182 as well as on the sidewalls of the contact trenches 470. A conformal conductive layer 155 may be deposited to fill the recess grooves 150a in the cell trenches 450 and the voids in the field plate trenches 460. A further photolithographic process may pattern a third mask layer deposited on the conformal conductive layer 155 to form a third mask 530 for defining gate and field plate connection stripes.

FIG. 16E shows the third mask 530 comprising line portions 530 in the vertical projection of the cell and field plate trenches 450, 460. Outside the cell and field plate trenches 450, 460 the conformal conductive layer 155, which may consist of or contain heavily doped polycrystalline silicon, may cover the first surface 101, the thinned conformal dielectric layer 200b and may line the contact trenches 410.

As shown in the second cross-sectional view of FIG. 16E, portions of the conformal conductive layer 155 filling the recessed grooves 150a form buried gate electrodes 150, wherein the gate dielectrics 205 dielectrically insulate the buried gate electrodes 150 from the channel/body zones 115 in the second fin sections 182. The thickness of the conformal conductive layer 155 may be in the range from 50 to 200 nm, for example between 80 and 120 nm. Portions of the conformal conductive layer 155 filling the voids in the field plate trenches 460 form buried field plate electrodes 160.

An isotropic etch may remove exposed portions of the conformal conductive layer 155 above the first surface 101 and in the contact trenches 410 to form gate and field plate connection stripes 151, 161.

FIG. 16F shows the field plate connection stripes 161 extending along the second lateral direction and structurally and electrically connecting buried field plate electrodes 160 assigned to the same column of field plate stripes 360. The gate connection stripes 151 extend along the second lateral direction and structurally and electrically connect buried gate electrodes 150 assigned to the same column of cell stripes 350.

A dielectric material, for example a silicon oxide, may be deposited at a high deposition rate in a HDP (high deposition rate) process to form a non-conformal dielectric layer 220, wherein the deposition rate outside the contact trenches 470 may be higher than within the contact trenches 470, for example along the sidewalls of the contact trenches 470, and the deposition rate at the bottom of the contact trenches 470 may be higher than at the sidewalls.

FIG. 16G shows the deposited non-conformal dielectric layer 220 having a first thickness y1 outside the contact trenches 470 and a second thickness y2, which is significantly smaller than the first thickness y1, at the sidewalls of the contact trenches 470. According to an embodiment, the first thickness y1 is at least 100 nm, for example 150 nm, and the second thickness y2 is less than 50 nm, for example 30 nm. A third thickness y3 at the trench bottom may be greater than the second thickness y2, for example at least 100 nm.

The non-conformal dielectric layer 220 is isotropically etched with high selectivity against the semiconductor material of the semiconductor layer 100a. The etch process is stopped when the non-conformal dielectric layer 220 is completely removed from the sidewalls of the contact trenches 470 whereby remnants of the non-conformal dielectric layer 220 are still present outside the contact trenches 470 and at the bottom of the contact trenches 470.

Figure 16H:
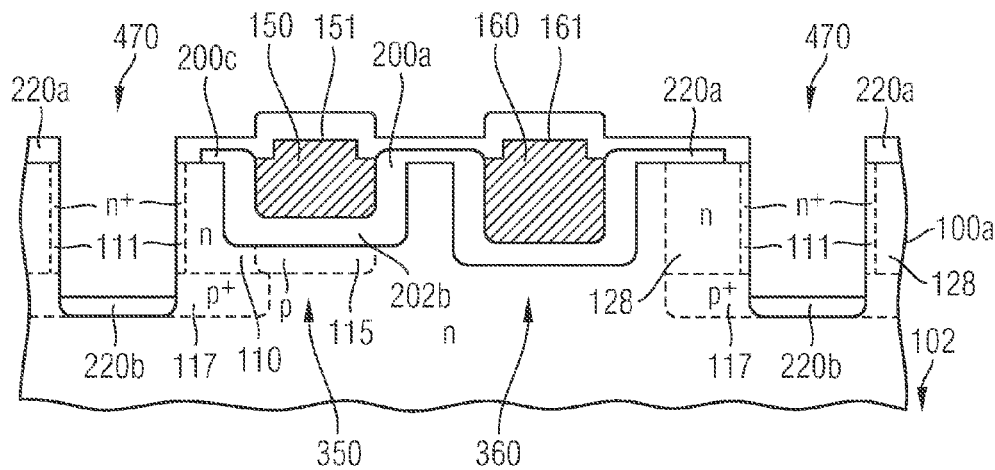
FIG. 16H shows a schematic combined cross-sectional view along lines A-B and B-C of the semiconductor substrate portion of FIG. 16G after providing source and drain zones.

FIG. 16H shows the contact trenches 470 with the sidewalls exposing the semiconductor material of the semiconductor layer 100a. First remnants 220a of the non-conformal dielectric layer 220 cover the area between neighboring contact trenches 470 and second remnants 220b the bottom of the contact trenches 470. The isotropic etch may be based on an etchant containing hydrofluoridic acid HF.

N type impurities may be introduced into regions of the semiconductor layer 100a directly adjoining the vertical sidewalls of the contact trenches 470, for example by way of an implant tilted to the normal to the first surface 101 and parallel to the first lateral direction. Implant damages may be annealed using an RTP (rapid thermal process). Alternatively or in addition, n type impurities may be introduced through the vertical sidewalls of the contact trenches 470 using a plasma diffusion process or out diffusion from a sacrificial layer. The second remnants 220b shield the bottom of the contact trenches 470 against introduction of impurities.

FIG. 16H shows source zones 110 and heavily doped source contact zones 111 extending along the vertical sidewalls of the contact trenches 470 at the side oriented to cell stripes 350 formed in place of the cell trenches 450. Along the sidewalls oriented to field plate stripes 360 formed in place of the field plate trenches 460, drain zones 128 and heavily doped drain contact zones 130 may be formed corresponding in dimensions and configuration to the source zones 110 and source contact zones 111.

The thick bottom oxide formed by the second remnants 220b in the contact trenches 470 may be removed and p type impurities may be implanted through the bottom of the contact trenches 470. Implant damages may be annealed and the semiconductor substrate 500a may be cleaned. A thin metal barrier liner 371 may be deposited that lines the contact trenches 470. The barrier liner 371 may consist of or contain titanium Ti, titanium nitride TiN, tantalum Ta, or tantalum nitride TaN and may have a thickness of at least 5 nm and at most 100 nm, for example at least 10 nm and at most 50 nm.

Figure 16I:
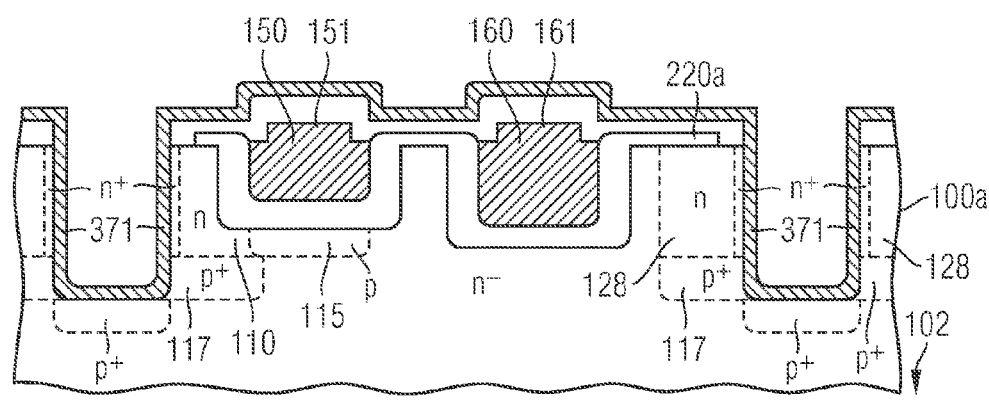
FIG. 16I is a schematic combined cross-sectional view corresponding to the cross-sectional view of FIG. 16H after providing a contact barrier liner.

FIG. 16I shows the barrier liner 371 lining the contact trenches 470 and covering the first remnants 220a of the non-conformal dielectric layer 220 outside the contact trenches 470. A contact fill material, for example tungsten W, may be deposited and chemically/mechanically polished using the second remnants 220b covering the gate and field plate connection stripes 151, 161 as an end point.

Figure 16J:
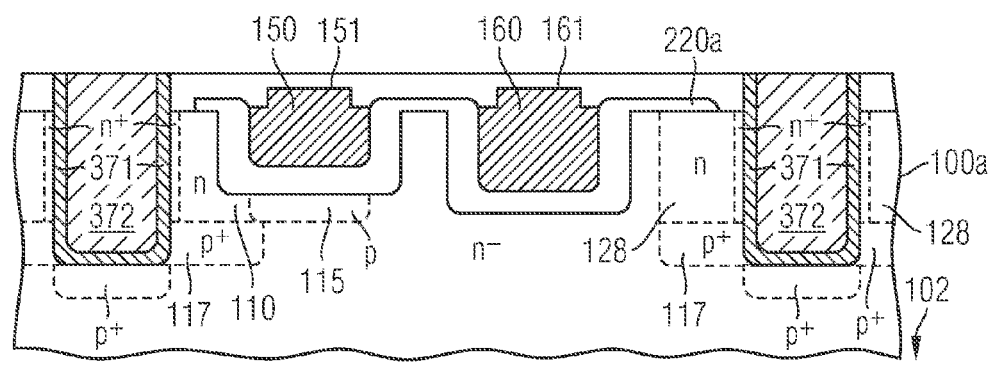
FIG. 16J is a schematic combined cross-sectional view corresponding to the cross-sectional view of FIG. 16I after polishing a fill portion of contact structures.

FIG. 16J shows the surface of the resulting contact stripes 370 with fill portions 372 of the contact fill material flush with the surface of the first remnants 220a of the non-conformal dielectric layer. A dielectric material consisting of or containing USG (undoped silicate glass), BSG (boron silicate glass), PSG (phosphorous silicate glass) or BPSG (boron phosphorous silicate glass) may be deposited and annealed to form an interlayer dielectric 230.

A further photolithographic process may pattern a further mask layer deposited on the interlayer dielectric 230 to form a further mask to form, in the interlayer dielectric 230, openings for contact plugs 305 to the buried contact structures 370, the gate connection stripes 151 and the field plate connection stripes 161 as shown in FIG. 16K. A further dielectric structure may be deposited and patterned to provide gate and field plate wiring.

FIG. 17 shows an alternative layout with the cell trenches 450 structurally connected to the contact trenches 470. The layout of FIG. 17 may be subjected to the method as described with reference to FIGS. 16A to 16K.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   providing dielectric stripe structures extending from a first surface into a semiconductor substrate between semiconductor fins;
   providing a first mask covering a first area including first stripe and fin sections and exposing a second area including second stripe and fin sections;
   forming channel/body zones in the second fin sections by introducing impurities using the first mask as an implant mask; and
   forming recess grooves in the second stripe sections using an etch mask based on the first mask.

2. The method of claim 1, wherein the first mask is used as the etch mask for forming the recess grooves.

3. The method of claim 1, further comprising:
   trimming the first mask after introducing the impurities and before forming the recess grooves; and
   using the trimmed first mask as the etch mask for forming the recess grooves.

4. The method of claim 1, further comprising:
   forming a gate dielectric along sidewalls and top surfaces of the second fin sections after forming the recess grooves in the second stripe sections, the top surfaces being parallel to the first surface.

5. The method of claim 4, further comprising:
   implanting impurities into sections of the semiconductor substrate exposed by end faces of the recess grooves, wherein
   the gate dielectric is formed by a thermal growth and a cell insulator contemporaneously formed by the thermal growth at exposed end faces of the recess grooves are formed thicker than the gate dielectrics.

6. The method of claim 1, further comprising:
   forming buried gate electrodes by filling the recess grooves with conductive material.

7. The method of claim 1, further comprising:
   introducing, by using position information contained in a trench mask defining the dielectric stripe structures, contact trenches extending in a second lateral direction orthogonal to longitudinal axes of the dielectric stripe structures parallel to the first surface.

8. The method of claim 7, further comprising:
   introducing, by using position information contained in the first mask, contact trenches extending in a second lateral direction orthogonal to longitudinal axes of the dielectric stripe structures parallel to the first surface.

9. The method of claim 1, further comprising:
   forming, using a single lithographic trench mask, cell trenches, field plate trenches and contact trenches extending from the first surface into the semiconductor substrate;
   forming the dielectric stripe structures in the cell trenches and from the dielectric stripe structures cell stripes; and
   forming field plate stripes in the field plate trenches and contact stripes in the contact trenches.

10. The method of claim 1, further comprising:
    providing, before providing the first mask, field plate stripes extending from the first surface into the semiconductor substrate in the first area, wherein longitudinal axes of the field stripe structures are parallel to longitudinal axes of the dielectric stripe structures parallel to the first surface.

11. The method of claim 10, wherein a second width w2 of the field stripe structures orthogonal to the longitudinal axes is greater than a first width w1 of the dielectric stripe structures orthogonal to the longitudinal axes.

12. The method of claim 11, further comprising:
    forming a conformal dielectric layer having a thickness greater than half of the first width w1 and smaller than half of the second width w2.

13. The method of claim 1, wherein:
    the first mask covers a third area including third stripe and fin sections, the third area spaced from the first area by the second area; and
    remnants of the dielectric stripe structures in the third area after forming the recess grooves form third cell insulator structures thicker than a gate dielectric formed in the fin sections.

14. The method of claim 1, further comprising:
    providing a source zone directly adjoining the channel/body zones in a first lateral direction defined by longitudinal axes of the dielectric stripe structures parallel to the first surface by introducing impurities through sidewalls of contact trenches formed by using positional information contained in the first mask or a trench mask for forming the dielectric stripe structures.

* * * * *